(12) United States Patent
Zuili et al.

(10) Patent No.: US 8,755,945 B2
(45) Date of Patent: Jun. 17, 2014

(54) EFFICIENT COMPUTER COOLING METHODS AND APPARATUS

(75) Inventors: Patrick Zuili, Boca Raton, FL (US); Todd Stabinski, Miami, FL (US); Daren Stabinski, Weston, FL (US); Joe Arnold, Oakland Park, FL (US)

(73) Assignee: Powerquest LLC, Weston, FL (US)

( * ) Notice: Subject to any disclaimer, the term of this patent is extended or adjusted under 35 U.S.C. 154(b) by 271 days.

(21) Appl. No.: 13/197,704

(22) Filed: Aug. 3, 2011

(65) Prior Publication Data

US 2012/0035773 A1 Feb. 9, 2012

Related U.S. Application Data

(60) Provisional application No. 61/370,759, filed on Aug. 4, 2010, provisional application No. 61/422,999, filed on Dec. 14, 2010, provisional application No. 61/514,316, filed on Aug. 2, 2011.

(51) Int. Cl.
*G05D 11/00* (2006.01)

(52) U.S. Cl.
USPC .............................. 700/282; 60/408; 62/498

(58) Field of Classification Search
USPC .............................. 700/282; 60/408; 62/498
See application file for complete search history.

(56) References Cited

U.S. PATENT DOCUMENTS

| | | | |
|---|---|---|---|
| 2003/0173078 A1* | 9/2003 | Wellington et al. | 166/250.07 |
| 2007/0227170 A1 | 10/2007 | Peng | |
| 2009/0248212 A1* | 10/2009 | Cowans et al. | 700/282 |
| 2009/0272143 A1 | 11/2009 | Lin | |
| 2010/0023171 A1* | 1/2010 | Bittner et al. | 700/282 |
| 2010/0031681 A1* | 2/2010 | Dolin | 62/225 |
| 2010/0070085 A1* | 3/2010 | Harrod et al. | 700/276 |

FOREIGN PATENT DOCUMENTS

| | | |
|---|---|---|
| KR | 1020030074932 A | 9/2003 |
| KR | 1020030079553 A | 10/2003 |

* cited by examiner

*Primary Examiner* — Mohammad Ali
*Assistant Examiner* — Anthony Whittington

(57) ABSTRACT

Methods and apparatus control the temperature of an electronic component of a computer. A temperature sensor is read that measures a temperature of an electronic component of a computer. The speed of a compressor is adjusted based on the read temperature to maintain a pre-defined temperature range for the electronic component. The compressor compresses a refrigerant. The refrigerant is sent to a condenser that condenses the refrigerant. The refrigerant is sent to a heat exchanger that is thermally coupled to the electronic component and that transfers thermal energy from the electronic component to the refrigerant. Finally, the refrigerant is sent back to the compressor. Solenoid valves can be used to control the flow of refrigerant to heat exchangers for one or more additional electronic components.

8 Claims, 21 Drawing Sheets

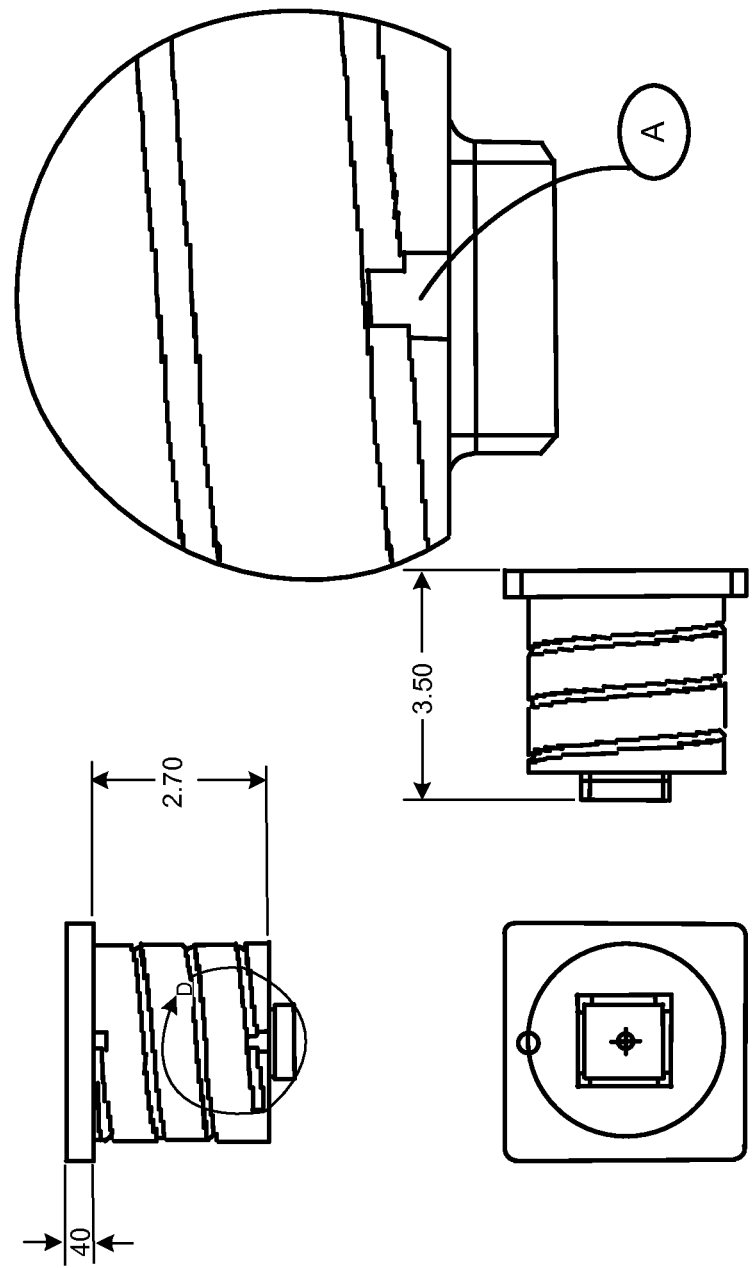

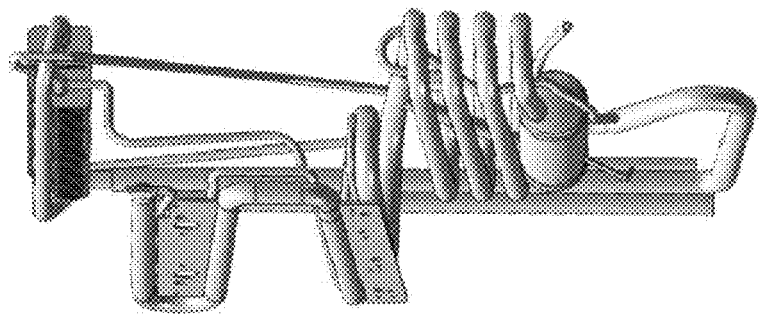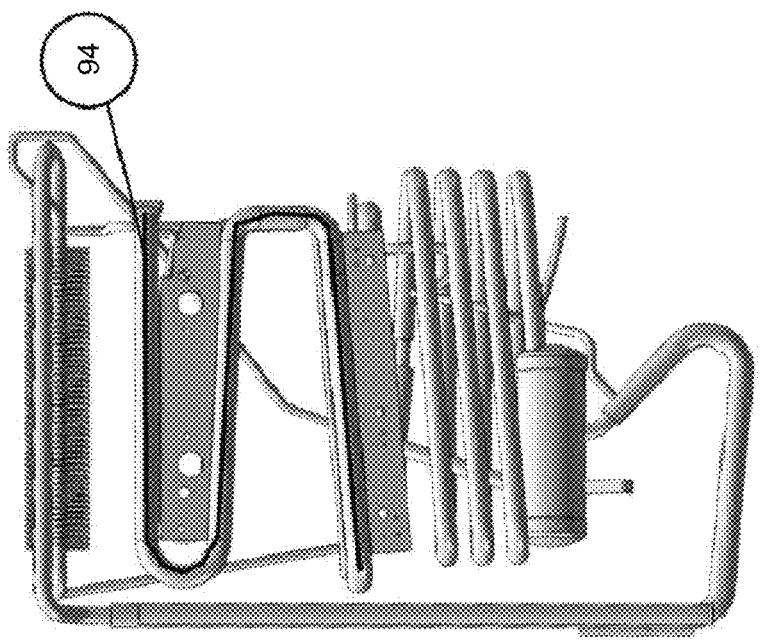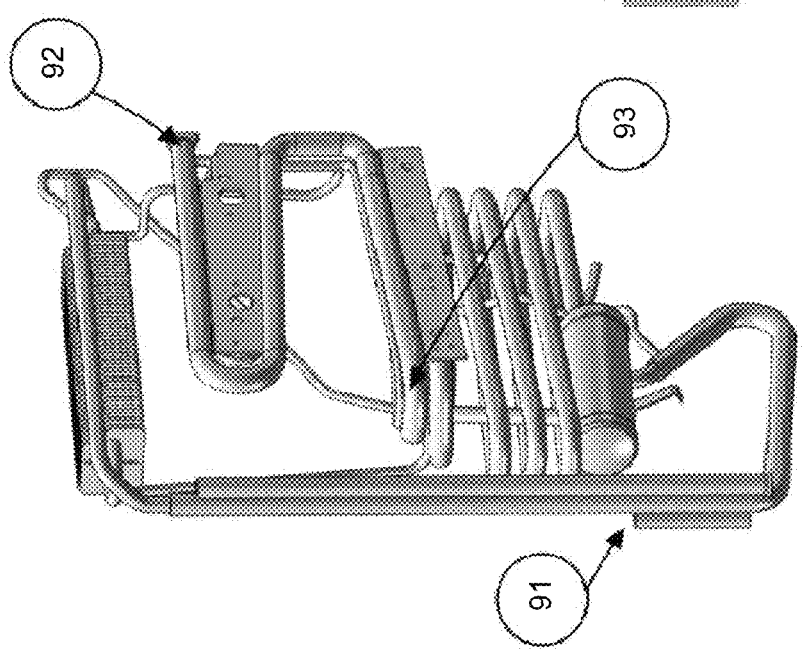
FIG. 9C
FIG. 9B
FIG. 9A

FIG. 13 SINGLE COMPRESSOR DESIGN

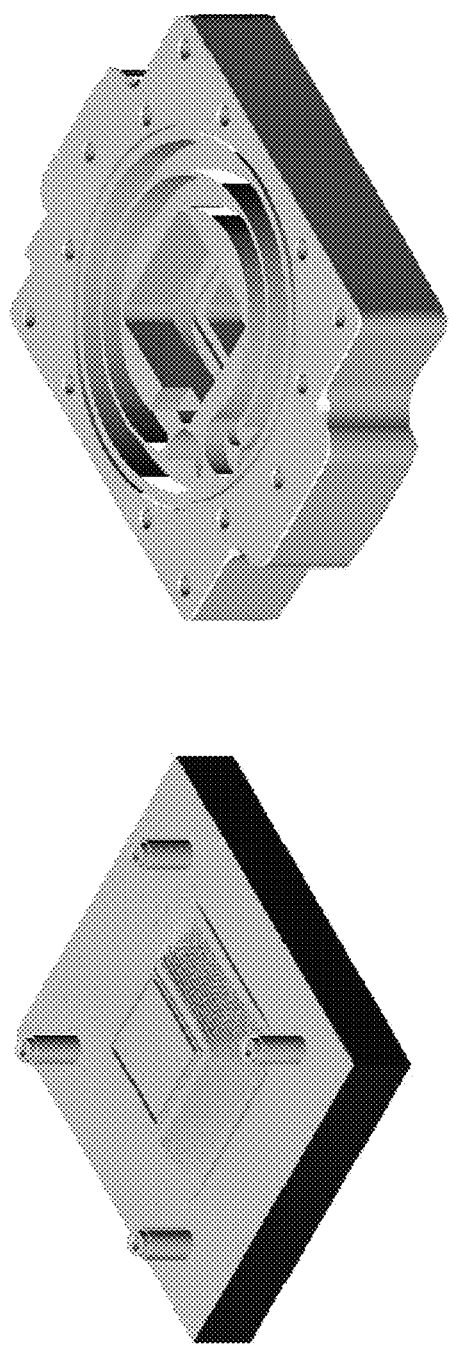
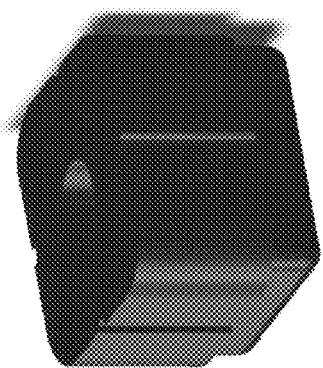
FIG. 15A
FIG. 15B
FIG. 15C

EFFICIENT COMPUTER COOLING METHODS AND APPARATUS

CROSS-REFERENCE TO RELATED APPLICATION

This application claims the benefit of U.S. Provisional Patent Application No. 61/370,759, filed Aug. 4, 2010, U.S. Provisional Patent Application No. 61/422,999, filed Dec. 14, 2010, and U.S. Provisional Patent Application No. 61/514,316, filed Aug. 2, 2011, which are incorporated by reference herein in their entireties.

BACKGROUND OF THE INVENTION

1. Field of the Invention

Embodiments of the present invention relate to cooling systems or refrigeration for computing systems. More particularly, the present invention relate to cooling systems with a unique structure to deliver cooling effect in highly efficient way to computing systems.

2. Background Information

Personal computers today mainly use fans that blow air from the outside environment into the computer case and past the electronic components such as the Central Processing Unit (CPU), Graphics Processing Unit (GPU), and motherboard. Often the CPU and GPUs are connected to heat sinks to absorb the heat from these components; however air is still used to remove the heat from the heat sinks. In the commercial arena, most of the small business don't use any specific means to cool down their server room beside their (pre-) existing air conditioning systems, which may provide a fixed (e.g., 77 F) temperature for the room, without any other method to verify that this temperature is constant. Often the same air conditioning system used for the server room is the exact same one used to cool down the offices nearby, the cost to install a dedicated cooling system just for the servers in a small business is far too expensive to install and operate. In larger businesses, companies spend a great deal of money on special infrastructure, such as large air conditioning units and architecture, and on energy costs, to properly cool their server computers, without solving the problems encountered by existing technology.

With existing technology, it is commonly known that cooling computers and servers is a difficult and inefficient task for multiple reasons. The first issue is that current technology uses air conditioning that cools the entire room in order to cool very small processors and electronic components within the computer, resulting in wasted energy. Existing technology also does not change the cooling capacity of the air conditioning based on the load of the computer, further wasting energy. Existing technology uses air to cool the electronic components, which is an inefficient method of heat transfer. Also, by blowing air through the computer, the electronic components are exposed to dust, moisture, and static, which are major causes of computer failure.

Water cooling is another existing technology that is used occasionally in higher end personal computers, and sometimes in commercial computers. In water cooling, water is piped into the computer through rigid or flexible tubing, and passed through solid metal cooling blocks attached to the hot electronic components. The water removes the heat from the blocks and is typically piped out of the computer into a radiator and fan apparatus, which removes the heat from the water, and the cycle is then repeated. While water cooling is more efficient than air cooling, it presents other problems. First, if the electronics are directly exposed to water, it will most likely cause short circuit and permanent damage. Second, the water cannot be cooled to temperatures lower than the dew point, or else it will cause condensation on the cooling blocks and again expose the electronics to water and potential permanent damage.

BRIEF DESCRIPTION OF THE DRAWINGS

The skilled artisan will understand that the drawings, described below, are for illustration purposes only. The drawings are not intended to limit the scope of the present teachings in any way.

FIGS. 8A-8D show the interior views of the CPU cooling block or appendage.

FIGS. 9A-9C describe another possible cooling device that may be incorporated into any of the embodiments of the present invention.

FIGS. 15 and 16 show two embodiments of diagrams of cooling blocks that may be used with the refrigeration circuit above, or that may be used with any type of liquid or phase change cooling for CPU and GPU cooling.

Figure 1:
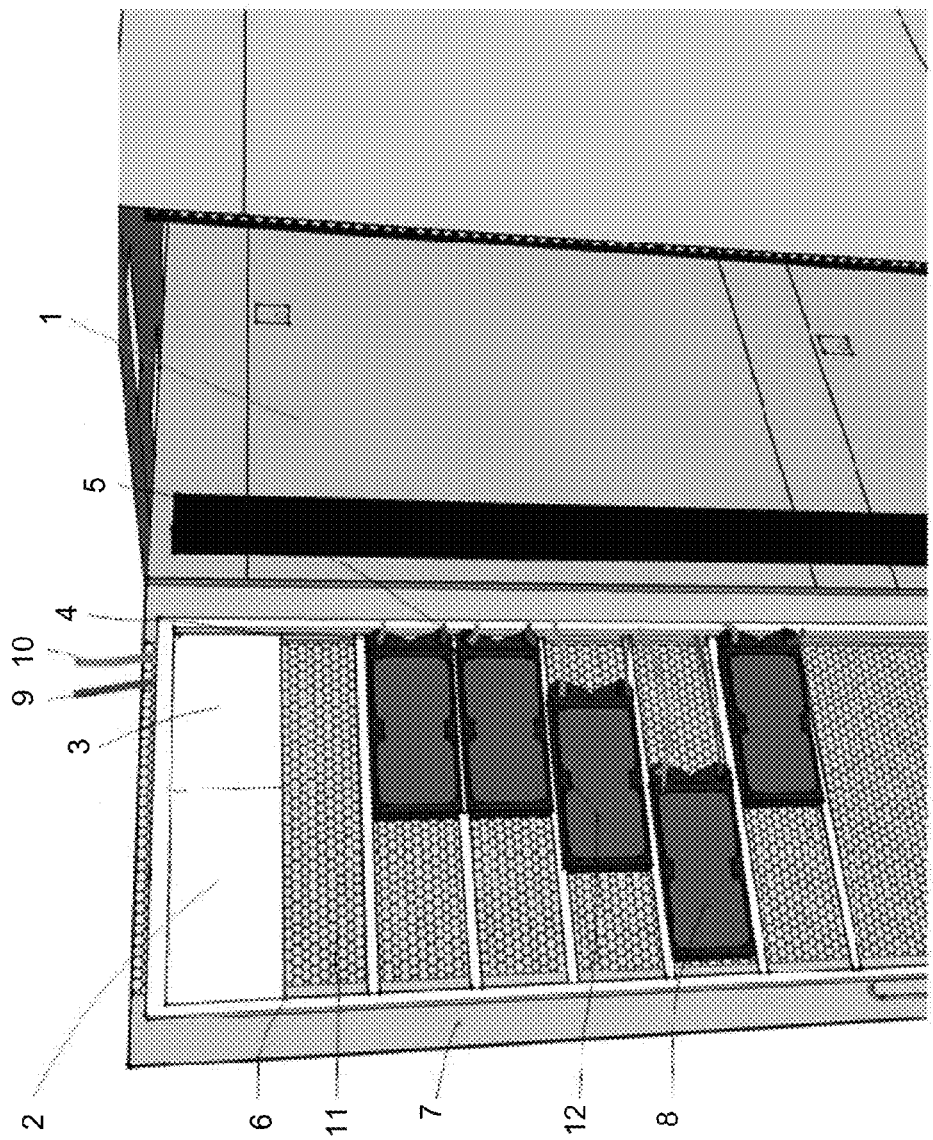
FIG. 1 shows the door of a standard rack used to house multiple server computers, according to an embodiment of the present invention.

Before one or more embodiments of the present teachings are described in detail, one skilled in the art will appreciate that the present teachings are not limited in their application to the details of construction, the arrangements of components, and the arrangement of steps set forth in the following detailed description or illustrated in the drawings. Also, it is to be understood that the phraseology and terminology used herein is for the purpose of description and should not be regarded as limiting.

DESCRIPTION OF VARIOUS EMBODIMENTS

The detailed description of the present invention is presented largely in terms of procedures, steps, logic blocks, processing, or other symbolic representations that directly or indirectly resemble the operations of devices or systems that produce coldness or cooling effect. These descriptions and representations are typically used by those skilled in the art to most effectively convey the substance of their work to others skilled in the art.

Reference herein to "one embodiment," "various embodiments," or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments.

Further, the order of blocks in process flowcharts or diagrams or the use of sequence numbers representing one or more embodiments of the invention do not inherently indicate any particular order nor imply any limitations in the invention.

Referring now to the drawings, in which like numerals refer to like parts throughout the several views. FIG. 1 shows an environment in which there are servers and other electronic equipment. It is commonly known that cooling servers is a difficult task for multiple reasons. The first issue is the determination of the heat load, understanding that every server depending on its work-load is going to generate heat, but most importantly need cool air to cool down its main components, CPU, memory, bridges, hard drives, video cards and etc. including enough humidity to prevent static and its disastrous effects on server and computer in general.

Most small businesses do not use any specific means to cool down their server rooms beside their existing air conditioning systems, which may provide a fixed (e.g., 77 F) temperature for the room, without any other method to verify that this temperature is constant. Often the same air conditioning system used for the server room is the exact same one used to cool down rooms nearby. Often the cost of installing a dedicated cooling system for the server room is prohibitively expensive.

One embodiment of the invention is shown in FIG. 1. FIG. 1 shows the door of a standard rack used to house multiple server computers. The door is made of a grid (11) with openings (holes) that allow air to pass through. The radiators may be screwed directly onto the grid, or a frame (6) may be used with tracks that allow the radiators to slide horizontally. The frame (6) may also be adjustable in height to accommodate various server sizes (e.g., 1 u, 2 u, 3 u, or 4 u). During use, the radiators should be positioned so that it sits directly in front of the air intake of the server/computer when the door is closed. A rubber border may be used around each radiator to create a seal between the radiator and server/computer when the door is closed. Each radiator has an inlet and outlet where hoses are connected to allow cold liquid to be pumped through the radiator. The use of non-spill connectors on each radiator is recommended to allow the connection or disconnection of the hoses without the possibility of spillage. The liquid may be water, glycol solution, or a dielectric liquid such as mineral oil. As the liquid is pumped through the radiator, it cools the fins of the radiator. Either the fan of the server/computer itself, or an external fan, may be used to blow ambient air through the radiator, thus allowing this cold air to flow through the server/computer and cool the components of the computer. FIG. 1 additionally shows rack (1), computer enclosure (2), solenoid valves and controllers (3), cold liquid radiator intake (4), hot liquid radiator out-take (5), door (7), radiator (8), main hot liquid out-take (9), main cold liquid intake (10), and temperature sensor/humidity sensor (12).

Figure 2:
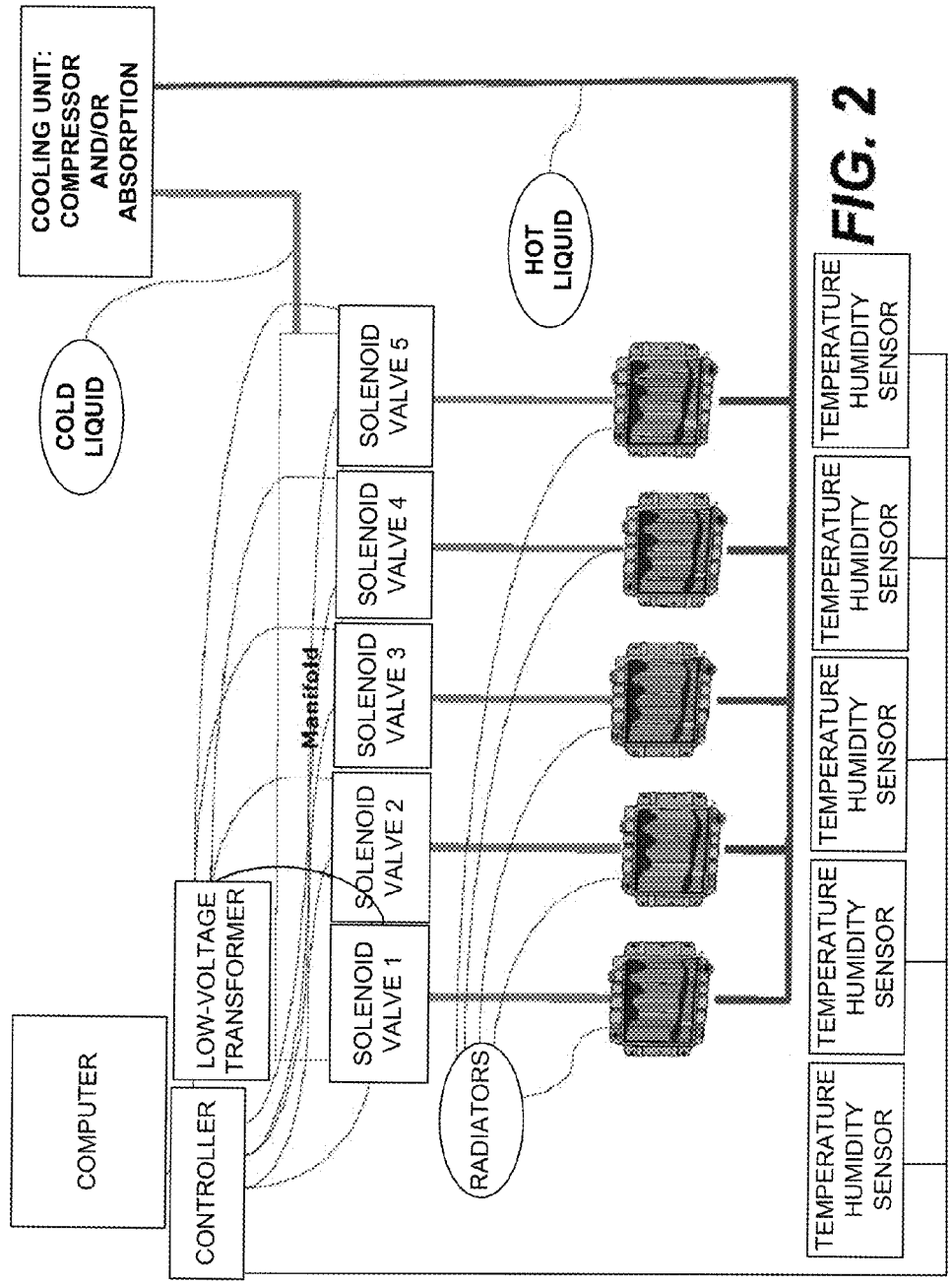
FIG. 2 shows a configuration of liquid cooling using a compressor(s) or absorption(s) alone or in combination according to one embodiment of the present invention.
Figure 3:
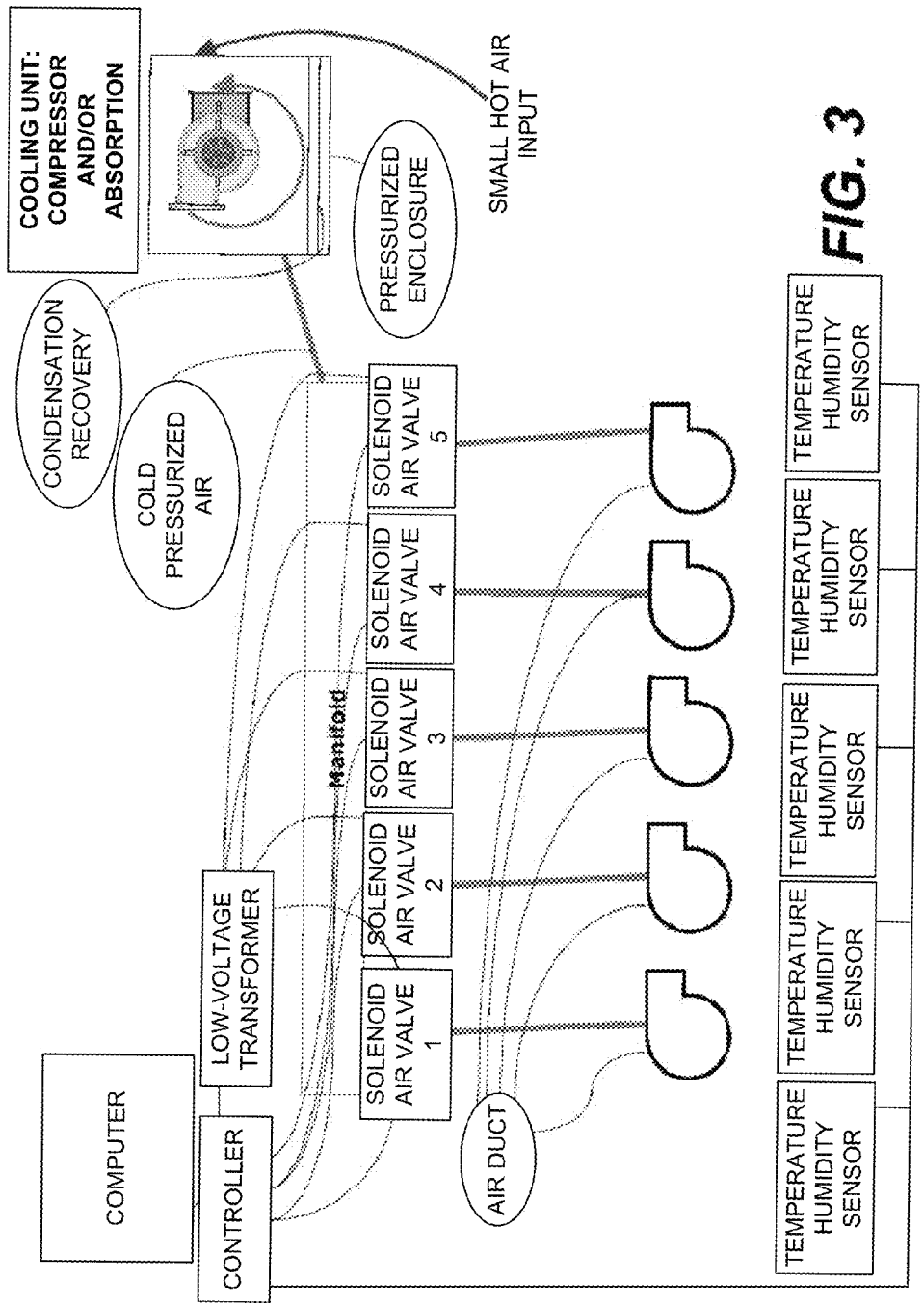
FIG. 3 shows a configuration of pressurized air cooling using a compressor(s) or absorption(s) alone or in combination according to one embodiment of the present invention.

The liquid is cooled through the process shown in FIGS. 2 and 3. The liquid is cooled in a cooling unit/chiller through the use of a standard phase change compressor, or through an absorption based process (such as FIG. 9 or U.S. Pat. No. 7,762,101). Another processes using two compressors, one of which is used as a subcooler, or a combination of any of these cooling methods may also be used.

The cool liquid then travels through a manifold that evenly distributes the liquid between each of the radiators. Each output of the manifold has a solenoid valve opens and closes depending on which of the radiators are in use. The solenoid valves are controlled by a separate computer program or controller board that receives data as to the computing load and/or temperature and/or humidity level of each server/computer. Since the computing load is directly proportional to server/computer temperature, either data would be sufficient. The computer program directs each solenoid value to either open or close depending on the cooling needs of each server/computer. This process acts as an energy saver as well, since it only provides cooling as needed.

Another embodiment of the invention is shown in FIG. 3. This process is similar to the liquid cooling above, except it uses a high pressure air blower that blows cold air, instead of liquid through a hose that travels to a manifold, whereby the air is distributed to each server/computer by separate hoses. Each output of the manifold has a solenoid valve opens and closes depending on which server/computer needs the cold air. The solenoid valves are controlled by a separate computer program or controller board that receives data as to the computing load and/or temperature and/or humidity level of each server/computer. Since the computing load is directly proportional to server/computer temperature, either data would be sufficient. The computer program directs each solenoid value to either open or close depending on the cooling needs of each server/computer. This process acts as an energy saver as well, since it only provides cooling as needed.

The air in this embodiment is cooled through the use of a standard phase change compressor, or through an absorption based process (such as FIG. 9 or U.S. Pat. No. 7,762,101). Another process using two compressors, one of which is used as a subcooler, may also be used to achieve lower temperatures. A combination of any of the above cooling methods may be used as well.

For either the liquid or air cooling embodiments, a software module is executed in a computer to control and manage cooling resources as well as the cooling effects in accordance to real time calculated dew point, temperature and humidity control by opening and closing solenoids and controlling cooling unit(s).

FIG. 2 shows a configuration of liquid cooling using a compressor(s) or absorption(s) alone or in combination according to one embodiment of the present invention. The designs provide the cooling effect to a heat exchanger attached to the cooling unit, (not shown in the graph). A pump (not shown in the Figure) is attached to the cooling unit that pumps the cold liquid to the radiators via the solenoid valves. Temperatures and humidity sensors send the sensing data to the computer that is configured to open and close liquid valves when temperatures and humidity are in the preset range of the controlling software.

Once the temperature exchange occurs, hot liquid is sent back to the heat exchanger attached to the cooling unit in order to complete the loop.

FIG. 3 shows a configuration of pressurized air cooling using a compressor(s) or absorption(s) alone or in combination according to one embodiment of the present invention. The air is cooling within a high pressurized blower/air handler, which sends the cold air through the hoses to the server/computers via the manifold and solenoid valves. Temperatures and humidity sensors send the sensing data to the computer which open and close the solenoid air valves when temperatures and humidity are in the preset range of the controlling software. Hot air may be exhausted out of the room or building.

The controlling software module can act alone or in combination with other software modules loaded into each of the servers, monitoring the CPU load, and dynamically controlling the cooling to the servers/computers that require cooling. These cooling methods may be monitored locally or remotely and/or also integrated into a central and/or cloud computing web based solution.

Figure 4:
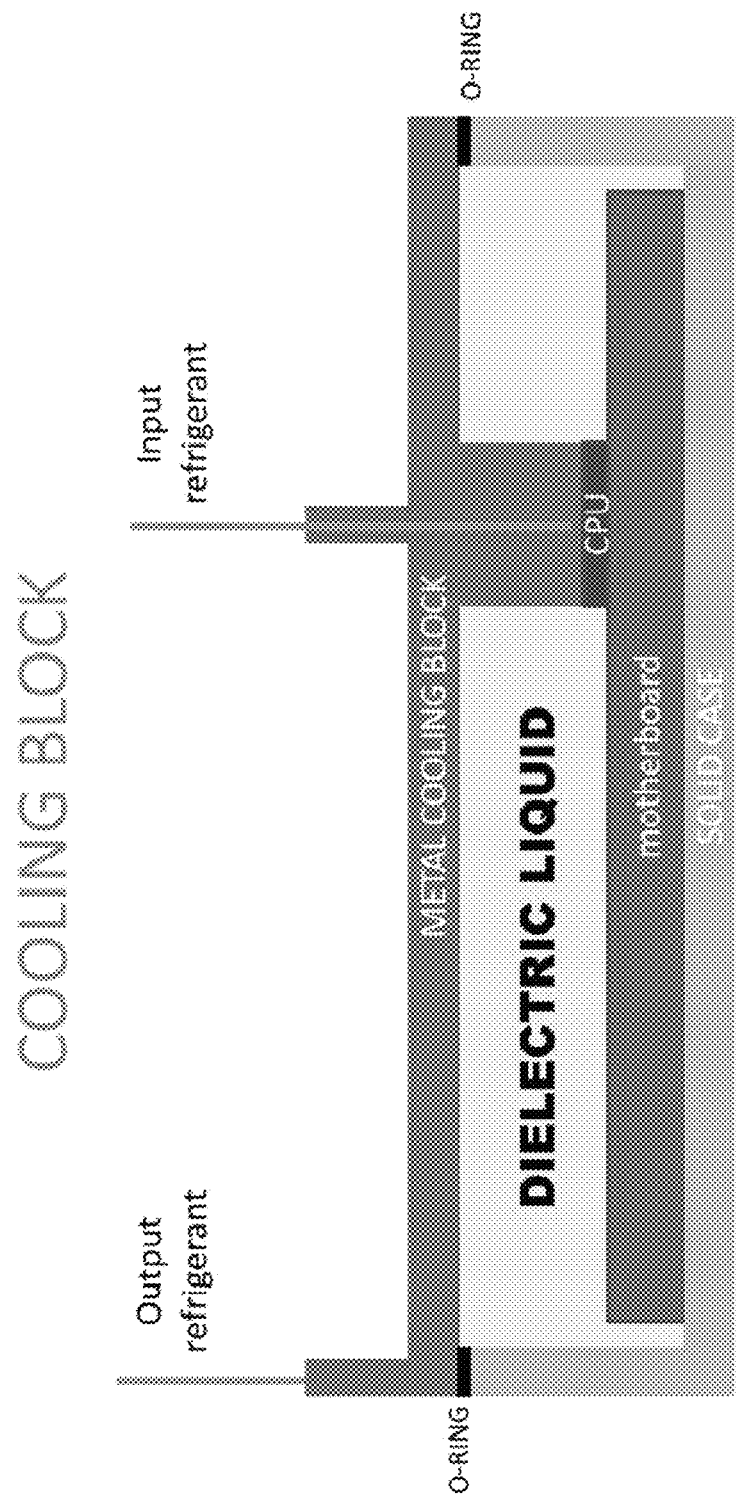
FIG. 4 shows another embodiment of the present invention, in which the computer/server motherboard components are submerged in a dielectric liquid (such as mineral oil) and sealed in a watertight case using o-rings.
Figure 5:
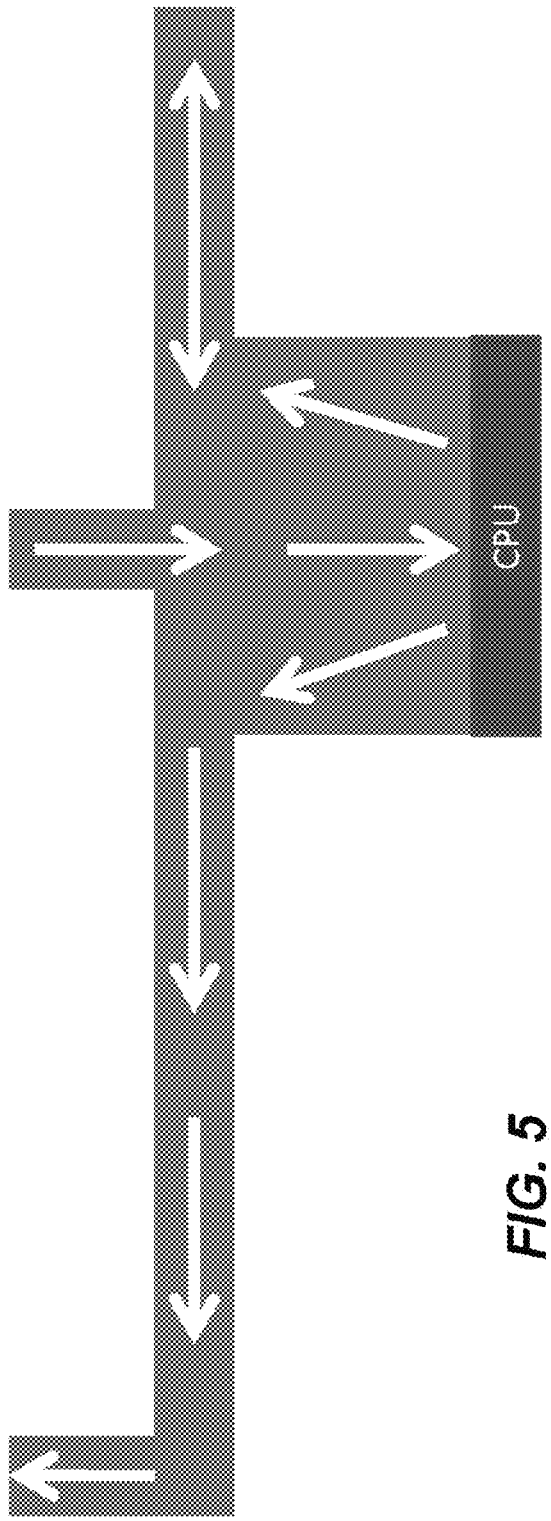
FIG. 5 shows an exemplary metal cooling block that comprises the top of the case of FIG. 4, which has cavities within the block to allow refrigerant to flow through the block and cool the block.

In another embodiment of the present invention, as shown in FIG. 4, the computer/server motherboard components are submerged in a dielectric liquid (such as mineral oil) and sealed in a watertight case using o-rings. A metal cooling block comprises the top of the case, which has cavities within the block to allow refrigerant to flow through the block and cool the block, as shown in FIG. 5. The metal cooling block contains an appendage that extends down onto the CPU of the computer and is in direct contact with the CPU, which is the part of the computer that generates the most heat.

Any type of refrigerant may be used, including any type of CFC or HCFC, other gases, water, glycol solutions, or dielectric liquid, depending on the cooling method, temperature, and efficiency desired. Various types of cooling methods for the refrigerant may be used, as previously mentioned above, including standard phase change compressor, an absorption based process (such as FIG. 9 or U.S. Pat. No. 7,762,101). Another process using two compressors, using one as a subcooler, may also be used. A combination of any of the above cooling methods may be used as well.

The refrigerant travels from one of the various types of cooling mechanisms to the input. (FIGS. 4 and 5). The input of the refrigerant directs the refrigerant first onto the CPU through the appendage, so that the CPU receives the coldest refrigerant. Thereafter, the refrigerant circulates through cavities throughout the rest of the cooling block, and the hot refrigerant eventually exits through the output and back to the chilling mechanism. Additional appendages (not shown in diagram) may be added to contact other components (e.g. GPU, memory, etc.) that require direct or additional cooling.

One aspect of the present invention is the large amount of mass used to efficiently absorb the surrounding heat created by the CPU and other components, differentiating this invention from other "CPU cooling blocks" currently on the market. This mass also allows for cold storage, allowing the compressor, absorption, or other cooling device to work less and only as needed, creating an energy saving effect.

Another aspect of the present invention is the width of the cooling block overhanging the entire motherboard, allowing natural downward radiant cooling from the block to the motherboard and components.

Through radiant cooling effects and direct contact, the metal cooling block transfers cold to the dielectric liquid, which, in turn, cools the motherboard and surrounding components. Additional components such as power supplies and solid state disk drive may also be submerged in the liquid within the case to keep them cool.

A pump (not shown in the diagram) may also be submerged within the case to circulate the liquid around the box and direct the liquid to components that require the most cooling. For example, the pump may be used to circulate the liquid through a water block that is attached to the GPU or memory sticks.

In another embodiment of the present invention (not shown in diagram), the metal cooling block has additional cavities or paths attached which can be used as a heat exchanger to pump the dielectric liquid through, and provide more efficient heat transfer to the dielectric liquid.

Watertight connectors should be used on the case to prevent leakage of the liquid, including but not limited to, connections for power, USB, SATA, ethernet, firewire, dvi, etc.

In another embodiment of the present invention, there may be an inlet and outlet on the computer case itself to be able to pump the dielectric liquid in and out of the case itself While the liquid is out of the case, in may be cooled through an outside heat exchanger, or run through a filter to remove any impurities or humidity (water) that may have contaminated the oil. This inlet and outlet may also be used to initially fill the case with oil, empty the oil in order to open the case to change any components, or replace the oil.

In another embodiment of the present invention, a design such as shown in FIG. 4 may be used without submersion in dielectric liquid. If submersion is not used, a system should be incorporated to remove humidity from inside the case to prevent condensation. A chemical dessicant with replacement cartridges is used in one embodiment. In another embodiment, a system that recirculates air in and out of the case, while removing humidity in the process, is used. The system may be computer controlled, as shown in exhibits 2 and 3, using data provided by temperature and humidity sensors within the case.

Figure 7B:
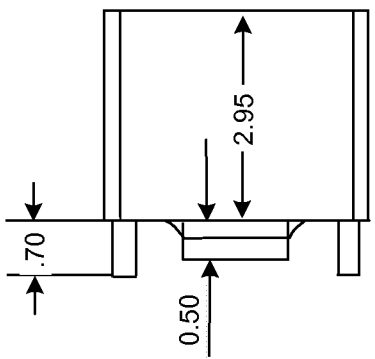
FIGS. 7A-7B show a bottom view and side view of the CPU cooling block or appendage.
Figure 6:
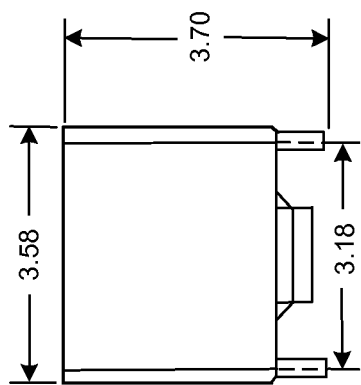
FIG. 6 shows a side view of an exemplary CPU cooling block or appendage.
Figure 7A:
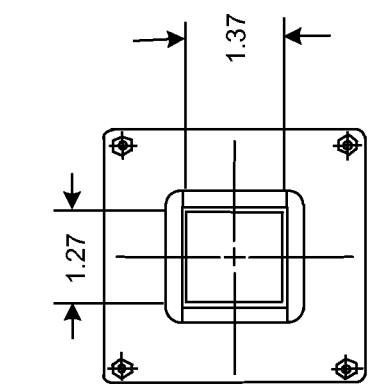

FIG. 6 shows a side view of an exemplary CPU cooling block or appendage. FIGS. 7A-7B show a bottom view and side view of the CPU cooling block or appendage.

FIGS. 8A-8D show the interior views of the CPU cooling block or appendage. In this embodiment, the interior portion of the CPU block fits into the outside portion in a piston-like manner It is designed to use the refrigerant in a unique centrifugal fashion to extract maximum heat from the CPU and achieve efficient heat transfer from the refrigerant. The refrigerant enters the block through the center of the block through capillary tubing and is sprayed onto the bottom surface of the block which is in direct contact with the top surface of the CPU.

There is an empty cavity within the bottom of the cooling block, creating a decrease in pressure, and thus vaporizing (or boiling) the refrigerant and allowing the refrigerant to absorb the surrounding heat from the CPU. The refrigerant then travels up the centrifugal path shown in FIG. 6 cooling the surrounding metal of the cooling block, and eventually exiting the cooling block and back to the cooling device.

In one embodiment, a liquid metal or solder type material may be used in between the block and CPU to aid in the heat transfer efficiency. In another embodiment, the bottom of the cooling block is left open and attaches through pressure with the CPU surface itself and sealed with an o-ring. In this embodiment, the refrigerant is sprayed directly onto the top surface of the CPU.

In one embodiment, the one or more compressors or absorption coolers used to cool the refrigerant are connected to a controller or circuit board that is controlled by a separate computer. This computer monitors the temperature of the CPU, the load of the CPU, and the temperature of the surrounding liquid, and turns the compressor or absorption coolers on or off based on preset values. This embodiment creates an energy saving feature to the invention, as the cooling devices are only used when needed.

FIGS. 9A-9C describe another possible cooling device that may be incorporated into any of the embodiments of the present invention. FIGS. 9A-9C are views of an absorption unit, where a cooling system operating on at least three types of working fluids that achieve low temperature evaporation and high temperature condensation to derive cooling effects; and a working unit powered by any heat source electrical or/and propane or/and natural gas where the electrical source (when used) alone or combined together can come from hybrid source like solar photovoltaic panels and or regular electrical grid, to utilize the cooling effects from the cooling system described in between (92) and (93).

FIGS. 9A-9C are views of an absorption unit, where heat is applied on (91), the cold area of the absorption is located in between (92) and (93), where an open tube (94) passes through the center of the cooling areas in between (92) and (93), in the open tube(94) preferably metal foam is embedded in the inside of the tube to increase the surface area contact and permit an efficient temperature exchange of the liquid circulating in this tube (94) number, as well as slowing down the circulation of the liquid in order to perform a better temperature exchange.

Multiple absorptions units could be merged together in this manner by connecting the inner tubes, to make the cooling area longer and provide increased cooling temperature and effect as needed. The circulating liquid can be any liquid, including but not limited to glycol, water, oils, and any dielectric liquid. A pump (not shown in the Figure) will push the liquid out of the cooling area (4) and directed it to any of the cooling processes exhibited in FIGS. 1-6 above.

In various embodiments, efficient cooling blocks attached to the CPU and GPU, using a phase change ozone-safe refrigerant to remove the heat from the blocks. The refrigerant is piped into the blocks through rigid or flexible tubing from a refrigeration circuit that is located away from the electronic components to be cooled. The electronic components, including the motherboard, CPU, and GPU are enclosed and sealed in a watertight case, and fully submerged in a dielectric liquid such as mineral oil.

In various embodiments, energy efficiency is improved by directing the cooling exactly where the cooling is needed. The cooling is directly on the electronic components, obviating the need for cooling the entire room. Since the electronic components are sealed and submerged, the dielectric liquid acts as an insulator to isolate the cooling precisely on the electronic components. Moreover, the cooling level is controlled through a circuit board that is directly connected to the BIOS of the computer, which monitors the load of the processors and increases or decreases the cooling capacity when needed. Second, through submersion, the subject invention protects the electronic components from dust, moisture, and static, which are major causes of computer failure and damage. Moreover, the refrigerant used is ozone safe hydro-fluorocarbon, which is safe for electronic components and for the environment. Third, also due to the submersion's insulative properties, the subject invention allows the user to cool the electronic components at temperatures far lower than due point, therefore increasing the efficiency of the CPU and GPU and allowing the user to overclock (increase the clock speed) of the processors without risk of condensation and short circuit.

Figure 10:
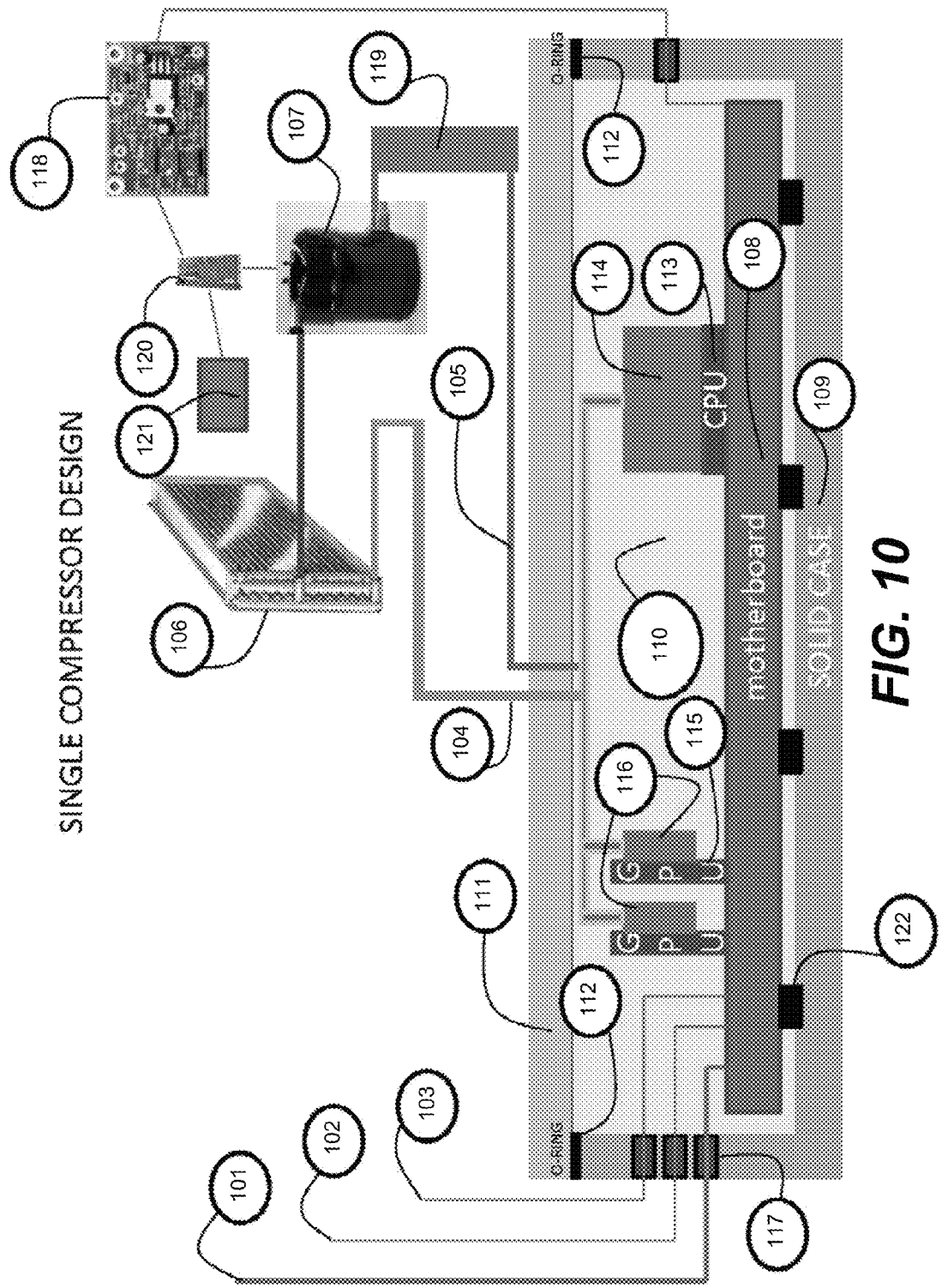
FIG. 10 shows an exemplary single compressor design, in which a computer motherboard, central processing unit (CPU), and graphics processing unit (GPU) are enclosed in a solid watertight case that may be made from metal or plastic.

As shown in FIG. 10, a computer motherboard (108), central processing unit (CPU) (113), and graphics processing unit (GPU) (115), are enclosed in a solid watertight case (109) that may be made from metal or plastic. Motherboard (108) is connected to watertight case (109) by supports (122), for example. The entire motherboard, CPU, and GPU, are submerged in dielectric fluid (110) which may be mineral oil, flourinert, or inert gas. The CPU and GPUs have solid metal cooling blocks (114 and 116) that have an input and output for refrigerant to flow through the block and remove heat from the CPU and GPU. The refrigerant may be a gas such a chlorofluorocarbon or hydrofluorocarbon. The refrigerant gas is compressed into a liquid by the compressor (107) and travels through rigid copper or flexible tubing to a condenser coil (106) that abuts a fan, which serves to cool the liquid, then travels through rigid copper or flexible tubing (104) to a capillary tube before entering the cooling block. At the point of the block closest to the CPU or GPU, the liquid path changes from high pressure to low pressure, which causes the liquid to boil into a gas (phase change) and remove heat that is absorbed by the cooling block. The gas then travels through the cooling block and continues to absorb the heat until it leaves the cooling block through the output. The gas then travels through the rigid copper or flexible tubing (105) to a receiver (119), which prevents liquid to enter the compressor, and then to the compressor, in order to repeat the cycle.

The solid case contains a solid top (111) that may also be made from metal or plastic. The solid case and solid top are separated by an o-ring (112) that seals the case and makes the case watertight. The solid case (109) also includes watertight pass-through glands or sealed connectors (117). There is a pass-through gland or sealed connector (117) for the power (101); the data such as USB, SATA, firewire, and network (102); and video and audio (103).

FIG. 10 also includes a circuit board (118) that converts PWM 1-12 volt power directly from the motherboard that is usually meant for CPU fan control to a linear 1-5 volt DC power. The circuit board is later described in FIG. 14. Also included is compressor controller 120 and compressor power supply 121.

Figure 11:
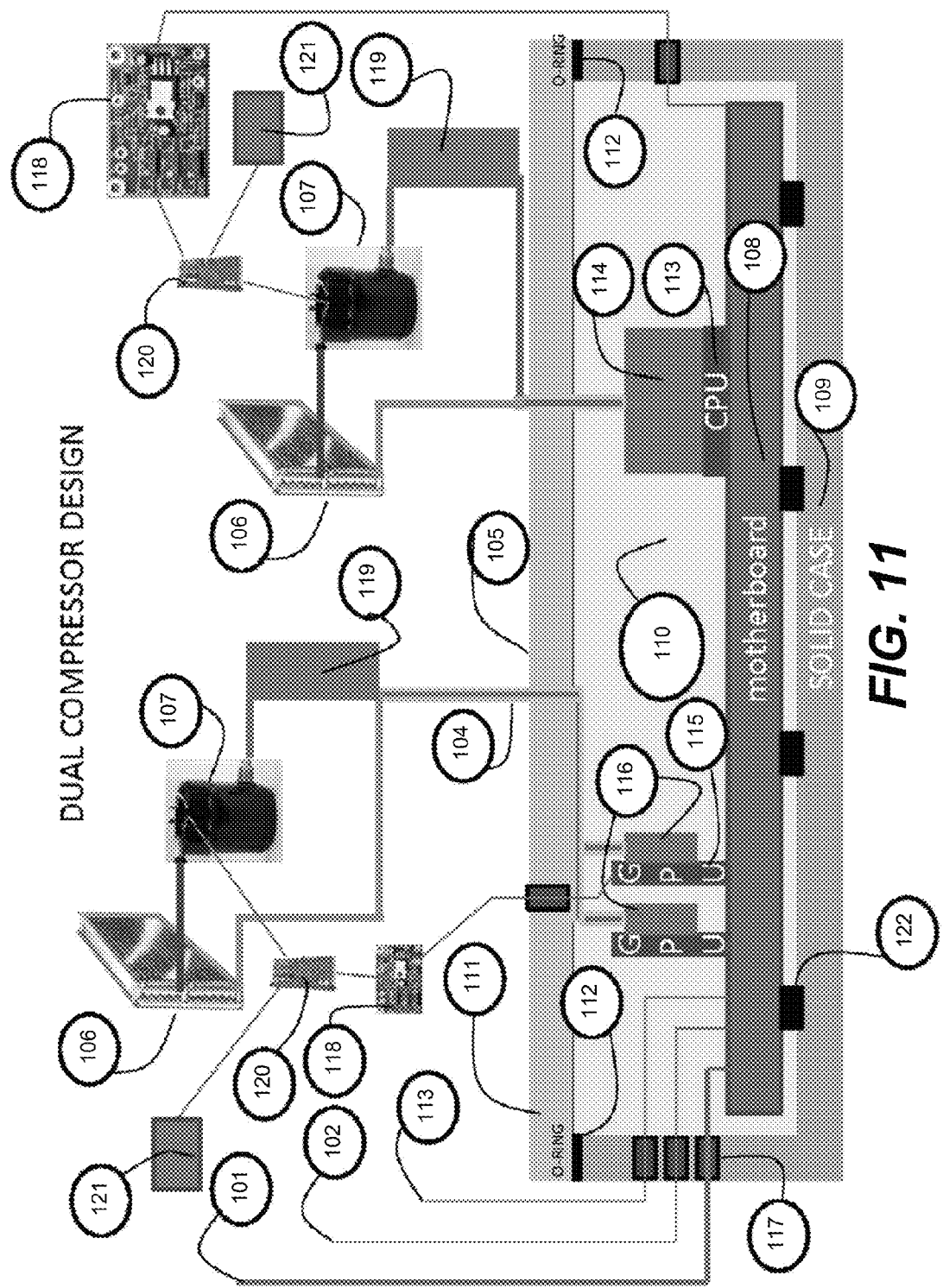
FIG. 11 shows an exemplary dual compressor design that includes a separate cooling circuit for the CPU and GPUs.

In another embodiment, FIG. 11 shows a dual compressor design similar to FIG. 10, but includes a separate cooling circuit for the CPU (113) and GPUs (115). Each cooling circuit includes its own compressor (107), condenser coil (106), and circuit board (118). All other aspects of this embodiment are the same as FIG. 10. A dual circuit condenser coil may be used to save space.

Figure 12:
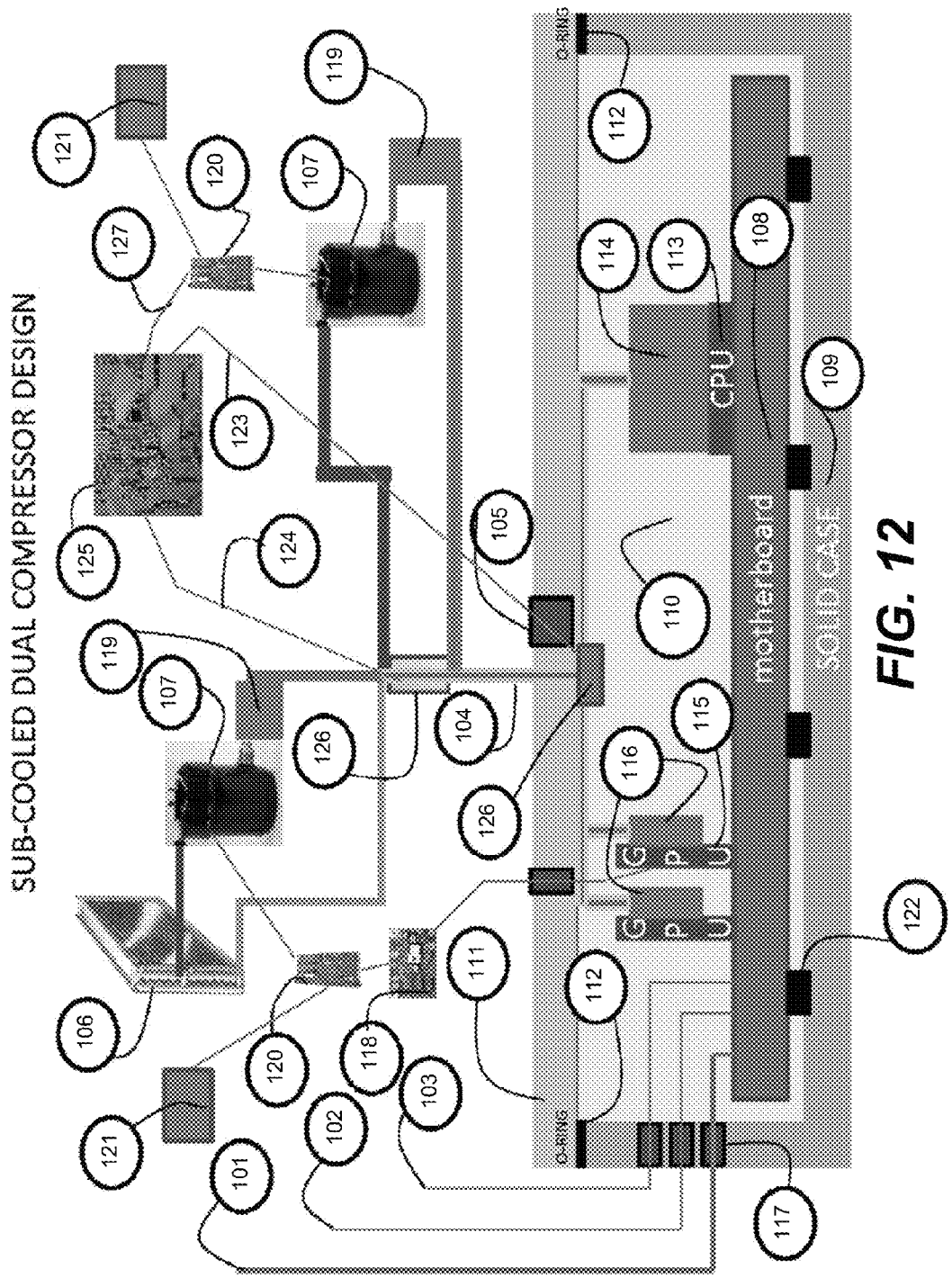
FIG. 12 shows another exemplary dual compressor design with two separate cooling circuits, each cooling circuit includes its own compressor, condenser coil, and circuit board.

In another embodiment, FIG. 12 shows a dual compressor design similar to FIGS. 10 and 11, also with two cooling circuits, each cooling circuit includes its own compressor (107). In this embodiment, one cooling circuit acts as a sub-cooler to cool the refrigerant gas from the other circuit before it re-enters the CPU and GPU, which may be controlled using proportional solenoid valves (126) to control the flow of refrigerant to either the CPU or GPU. Proportional solenoid valves (126) are controlled by controller (125), which monitors temperature sensor (124) and controls power supply (123). The use of the sub-cooler lowers the temperature and improves the cooling efficiency of the refrigerant when removing heat from the cooling block.

Figure 13:
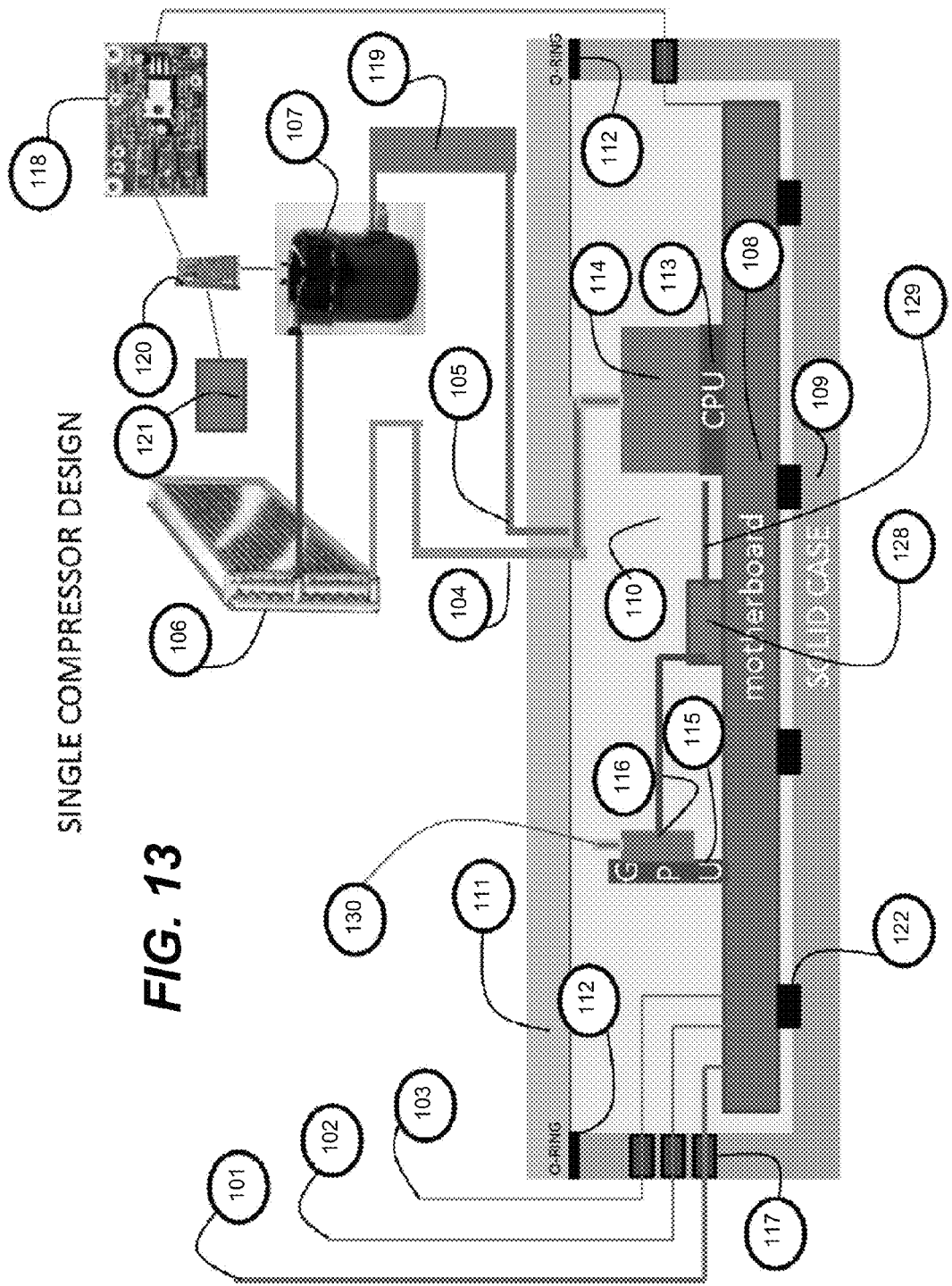
FIG. 13 shows another exemplary single compressor design in which the refrigeration circuit is only connected to the CPU block, not the GPU block(s).

In another embodiment, FIG. 13 shows a single compressor design similar to FIG. 10, however the refrigeration circuit is only connected to the CPU block, not the GPU block(s). Instead, a small pump (128) is located inside the solid watertight case which pumps cold dielectric liquid from cold oil input (129) that has been cooled by the CPU block (and in close proximity thereto) to the GPU block(s) and out hot oil output 130. In this embodiment where less cooling is needed for the GPU(s), the cold dielectric liquid acts as the refrigerant to remove the heat from the GPU(s). This liquid has been cooled by the CPU block through radiant cooling. This embodiment may be more practical and energy efficient for applications that require little or no graphics processing power, such as servers.

It should be noted that any of the embodiments listed above (FIG. 10-13) may be used with one or more CPUs and one or more GPUs, as either the refrigeration circuit may be split to accommodate multiple processors from a single refrigeration circuit. Alternatively, multiple compressors and/or refrigeration circuits may be used to accommodate additional CPUs and/or GPUs depending on the cooling load required.

Figure 14:
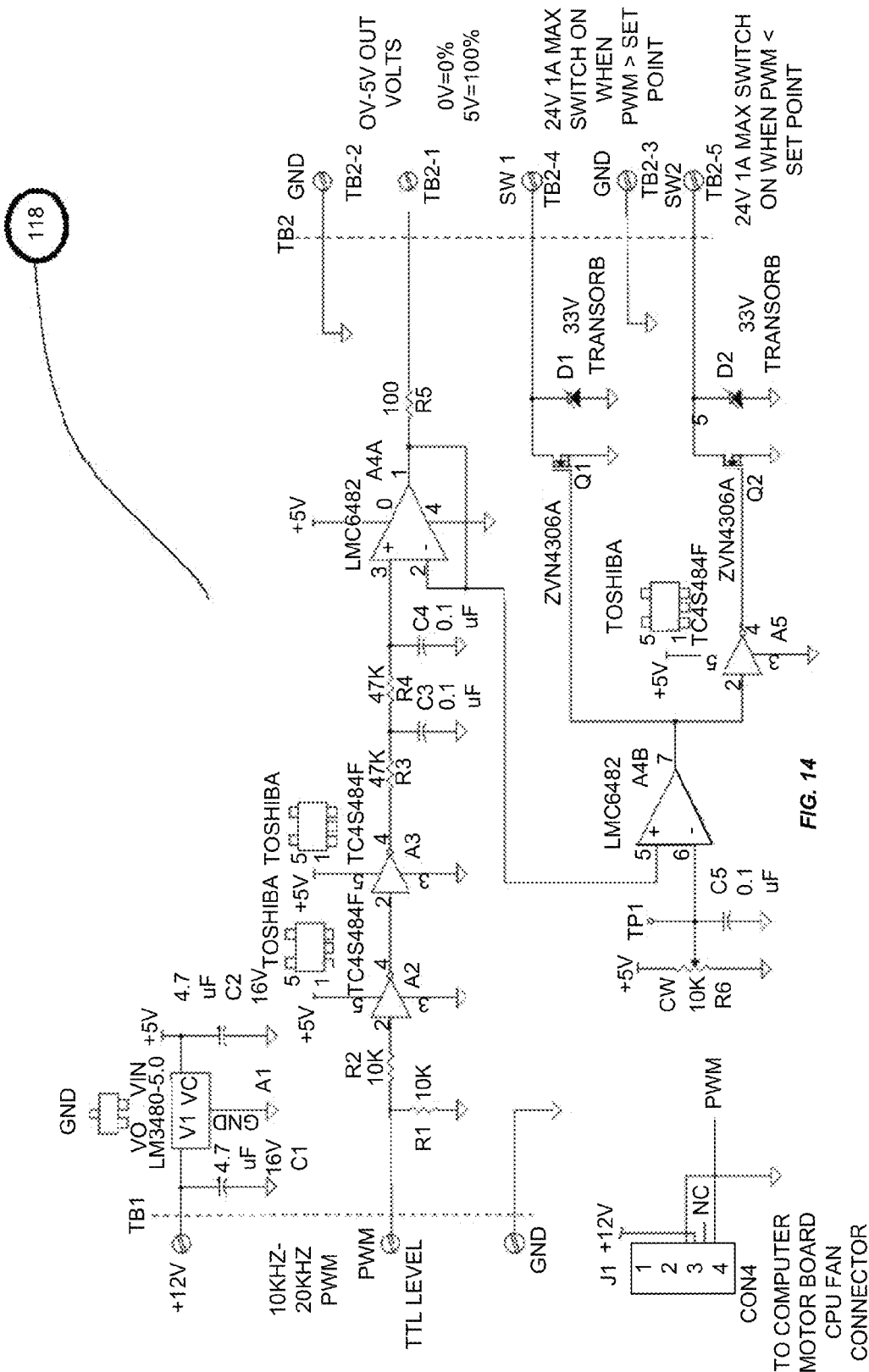
FIG. 14 shows a diagram of the pulse-width modulation (PWM) to linear voltage converter and solenoid controller circuit board.

FIG. 14 shows a diagram of the pulse-width modulation (PWM) to linear voltage converter and solenoid controller circuit board (118). A computer normally uses its BIOS (smart fan) to monitor the (temperature or load) of the processor and delivers electricity to the computer fan in the form of PWM from 0-12 volts. Therefore, as the (load or temperature) increases, the fan speed increases in order to remove more heat. In the subject invention, the compressors run on linear voltage from 0-5 volts. FIG. 14 converts the 0-12 volt PWM signal normally meant for the fan to a linear voltage from 0-5 volts in the same proportion to allow the BIOS to control the compressor speed in the same manner that it normally controls the fan based on the (load or temperature) of the processor. Although FIG. 14 is currently designed to convert to linear 0-5 volts due to the compressor controller used, the same design may be used to convert the PWM signal to any linear voltage (such as 0-12 volts or 0-24 volts) depending on the compressor controller used. As an optional feature (not shown on schematic), a USB connection may be used to perform voltage adjustments through a device driver allowing local and/or remote operation and maintenance of the cooling circuit. FIG. 14 also controls solenoid values for use in the embodiment shown in FIG. 12, to control the flow of refrigerant based on (load or temperature). If two PWM to linear circuit boards are require to be connected in parallel (e.g. using a dual processor motherboard with a single compressor), then diode should be added to the 0-5V output in order to prevent current flow-back.

FIGS. 15 and 16 show two embodiments of diagrams of cooling blocks that may be used with the refrigeration circuit above, or that may be used with any type of liquid or phase change cooling for CPU and GPU cooling. These cooling blocks are secured on top of the CPU and/or GPU processors to remove heat from the processor during operation.

FIGS. 15A-15C shows one embodiment of CPU/GPU cooling block or appendage. It is designed to use the refrigerant in a unique centrifugal fashion to extract maximum heat from the processor and achieve efficient heat transfer from the refrigerant. FIG. 15A shows the bottom view that is designed to sit on the processor and has attachments to screw onto the motherboard. FIG. 15B shows the top and interior view. FIG. 15C shows an additional pill-type cube. If phase change refrigerant is used, an additional pill-type cube is added to sit over the empty cavity in the center of the block (shown in FIG. 15B). The cube includes a hole though the center which acts as a metering device (by adding capillary tube, micro-jet, or expansion valve) where the refrigerant enters through under high pressure and sprays the refrigerant onto the bottom surface of the block which is in direct contact with the top surface of the processor. There is an empty cavity within the bottom of the cooling block, creating a decrease in pressure, and thus vaporizing (or boiling) the refrigerant and allowing the refrigerant to absorb the surrounding heat from the CPU. The refrigerant then travels up the centrifugal path shown in FIG. 15B cooling the surrounding metal of the cooling block, and eventually exiting the cooling block and back to the cooling device.

Figure 16A:
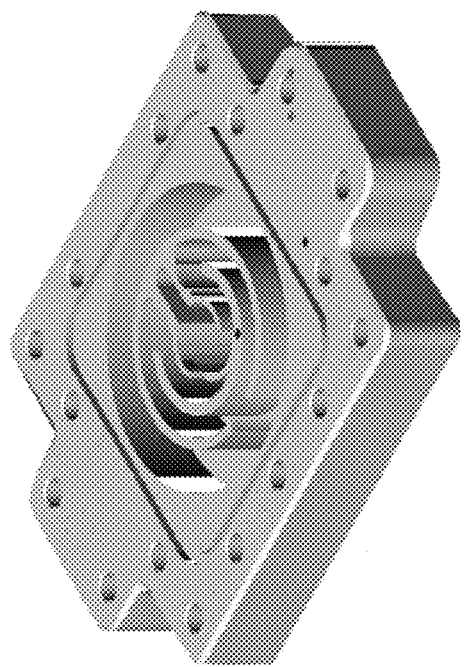
Figure 16B:
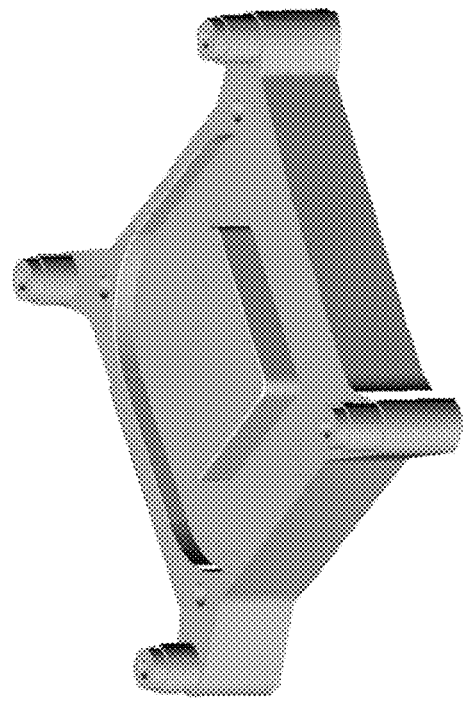

FIGS. 16A-16-B show another embodiment of CPU/GPU cooling block or appendage. It is also designed to use the refrigerant in a unique centrifugal fashion to extract maximum heat from the processor and achieve efficient heat transfer from the refrigerant. FIG. 16A shows the bottom view that is designed to sit on the processor and has attachments to screw onto the motherboard. FIG. 16B shows the top and interior view. The refrigerant enters the block through the center of the block through capillary tubing and is sprayed onto the bottom surface of the block (shown in FIG. 16B) which is in direct contact with the top surface of the CPU. There is an empty cavity within the bottom of the cooling block, creating a decrease in pressure, and thus vaporizing (or boiling) the refrigerant and allowing the refrigerant to absorb the surrounding heat from the CPU. The refrigerant then travels up the centrifugal path shown in FIG. 15B cooling the surrounding metal of the cooling block, and eventually exiting the cooling block and back to the cooling device. FIG. 16A includes another safety feature, (that may be also added to FIG. 15A or any other cooling block) which is a grove where insulation may be added to insulate the electronic components of the motherboard from any possible condensation (if submersion with dielectric liquid (110), as shown in FIGS. 10-12, is not used).

In one embodiment, a liquid metal or solder type material may be used in between the block and CPU to aid in the heat transfer efficiency. In another embodiment, the bottom of the cooling block is left open and attaches through pressure with the CPU surface itself and sealed with an o-ring. In this embodiment, the refrigerant is sprayed directly onto the top surface of the CPU.

In various embodiments, the system may also be used without submersion in dielectric liquid by adjusting the temperature of the cooling blocks through the BIOS with the PWM to linear conversion circuit, and maintaining the temperature above the dew point to avoid issues with condensation. If the system is used without submersion, insulation may be used under and/or around the cooling block as additional safety to prevent any possible condensation issues.

In a system without submersion in dielectric liquid efficient cooling blocks are attached to a CPU, GPU, Networks Card, memory, add-on card, or any other computer device that generates heat, using a phase change refrigerant to remove the heat from the blocks. The refrigerant is piped into the blocks through rigid or flexible tubing from a refrigeration circuit that is located away from the electronic components to be cooled. The amount of cooling supplied to the blocks changes based on the load/heat of the electronic components.

This embodiment provides energy savings by directing the cooling exactly where and when the cooling is needed. The cooling is directly on the electronic components, obviating the need for cooling the entire room. The cooling level may be controlled in using various methods to monitor the heat of the components, and various methods to control the cooling system based on that reading. The system moves the heat only once (from the heat source to the outside environment) as opposed to air cooling which requires the heat to be moved twice (from the heat source to the air to the outside environment), resulting in better efficiency. Since the use of fans in a computer chassis may be eliminated or limited, the system protects the electronic components from dust, moisture, and static, which are major causes of computer failure and damage. Moreover, the refrigerants typically used are safe for electronic components in the event of a leak. Due to the system's ability to control the temperature of the cooling blocks, the system allows the user to cool the electronic components at temperatures close to but not below the dew point, therefore increasing the efficiency of the CPU and GPU, co-processing card, FPGA, network card, hard disk, Solid State Drive, and/or add-on card, and allowing the user to overclock (increase the clock speed, voltage, and frequency) of the CPU or GPU without risk of condensation and short circuit. Insulation may be used under and/or around the cooling block as additional safety to prevent any possible condensation issues.

Figure 17:
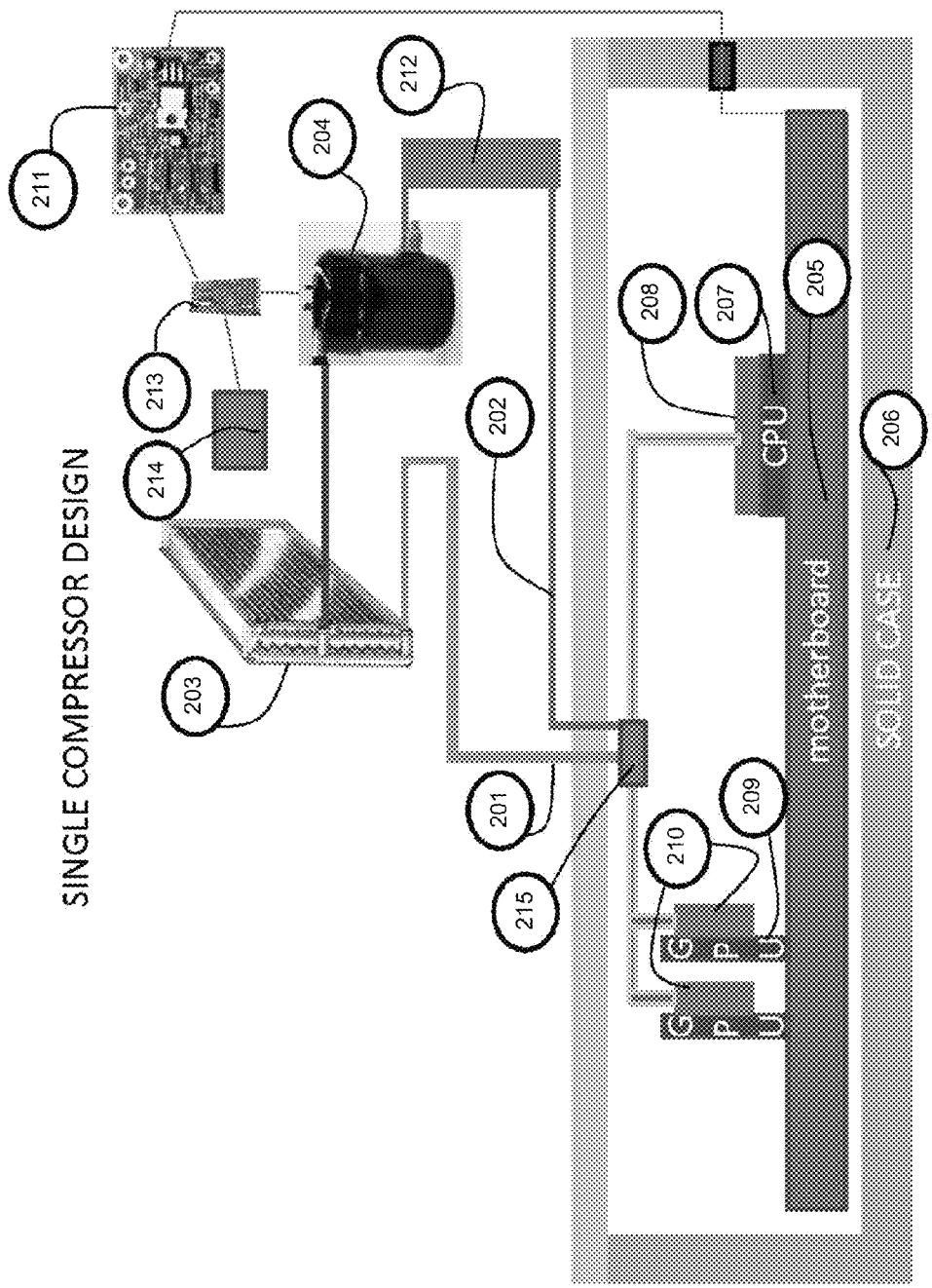
FIG. 17 is a schematic diagram of a single compressor system for controlling the temperature of an electronic component of a computer, in accordance with various embodiments.

FIG. 17 is a schematic diagram of a single compressor system (1700) for controlling the temperature of an electronic component of a computer, in accordance with various embodiments. FIG. 17 includes computer motherboard (205), central processing unit (CPU) (207), and graphics processing unit (GPU) (209) enclosed in solid case (206) that may be made from metal and/or plastic. The CPU and GPUs have solid metal cooling blocks (208 and 210) that have an input and output for refrigerant to flow through the block and remove heat from the CPU and GPU and optionally any other devices/cards connected to the motherboard. The refrigerant may be a gas such a chlorofluorocarbon or hydrofluorocarbon. The refrigerant gas is compressed by the compressor (204) and sent to the condenser coil (203) that includes a condenser fan (not shown) to remove the heat from the gas and thus condensing to a liquid state. The refrigerant gas travels through a rigid copper or flexible tubing to the condenser coil (203) that abuts the fan, which serves to cool the liquid. The high pressure, cooled, liquid refrigerant then travels through rigid copper or flexible tubing to a capillary tube/ or thermal expansion valve (201) before entering the cooling block. At the entrance point of the block, the injected liquid refrigerant changes from high pressure to low pressure, which causes the liquid to boil into a gas (phase change) and remove heat that is absorbed by the cooling block. The gas then travels through the cooling block and continues to absorb the heat until it leaves the cooling block through the output. The gas then travels through the rigid copper or flexible tubing (202) to a receiver (212), which prevents unused liquid to enter the compressor and the cycle repeats. Other components may be added to the system. Solenoid valves (215), for example, may be used to control the flow of refrigerant to either the CPU or GPU or both.

FIG. 17 includes a circuit board (211) that converts PWM 1-12 volt power directly from the motherboard that is usually meant for CPU fan control, GPU PWM, or add-on cards PWM to a linear 1-5 volt DC power. The circuit board (211) is, for example, described in FIG. 14. FIG. 17 also includes compressor controller (213) and compressor power supply (214).

Figure 18:
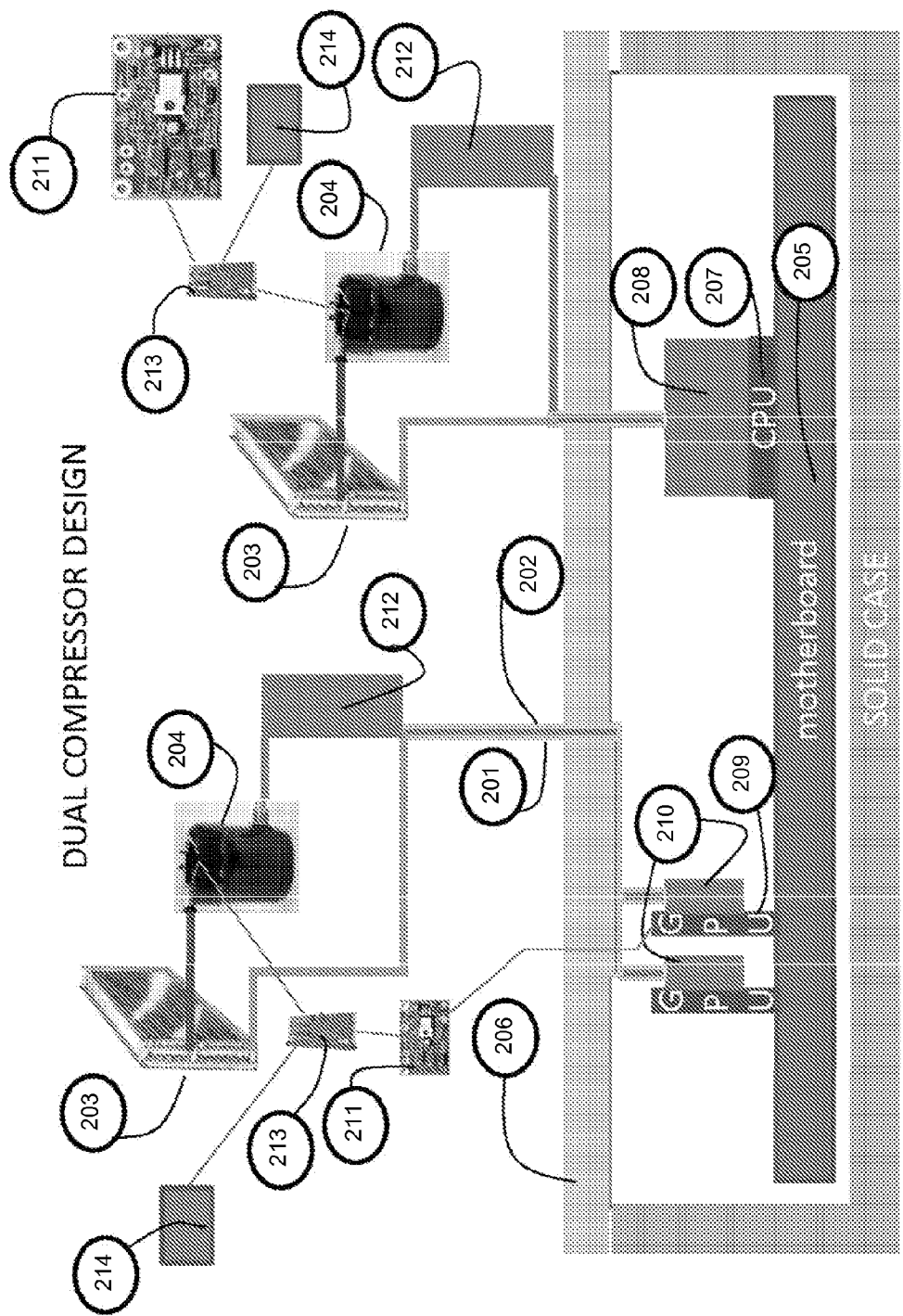
FIG. 18 is a schematic diagram of a dual compressor system for controlling the temperature of an electronic component of a computer, in accordance with various embodiments.

FIG. 18 is a schematic diagram of a dual compressor system (1800) for controlling the temperature of an electronic component of a computer, in accordance with various embodiments. FIG. 18 includes a separate cooling circuit for the CPU (207) and GPUs (209). Each cooling circuit includes its own compressor (204), condenser coil (203), and circuit board (211). All other aspects of this embodiment are the same as FIG. 17. In various embodiments, a dual circuit condenser coil system is used to save space.

Figure 19:
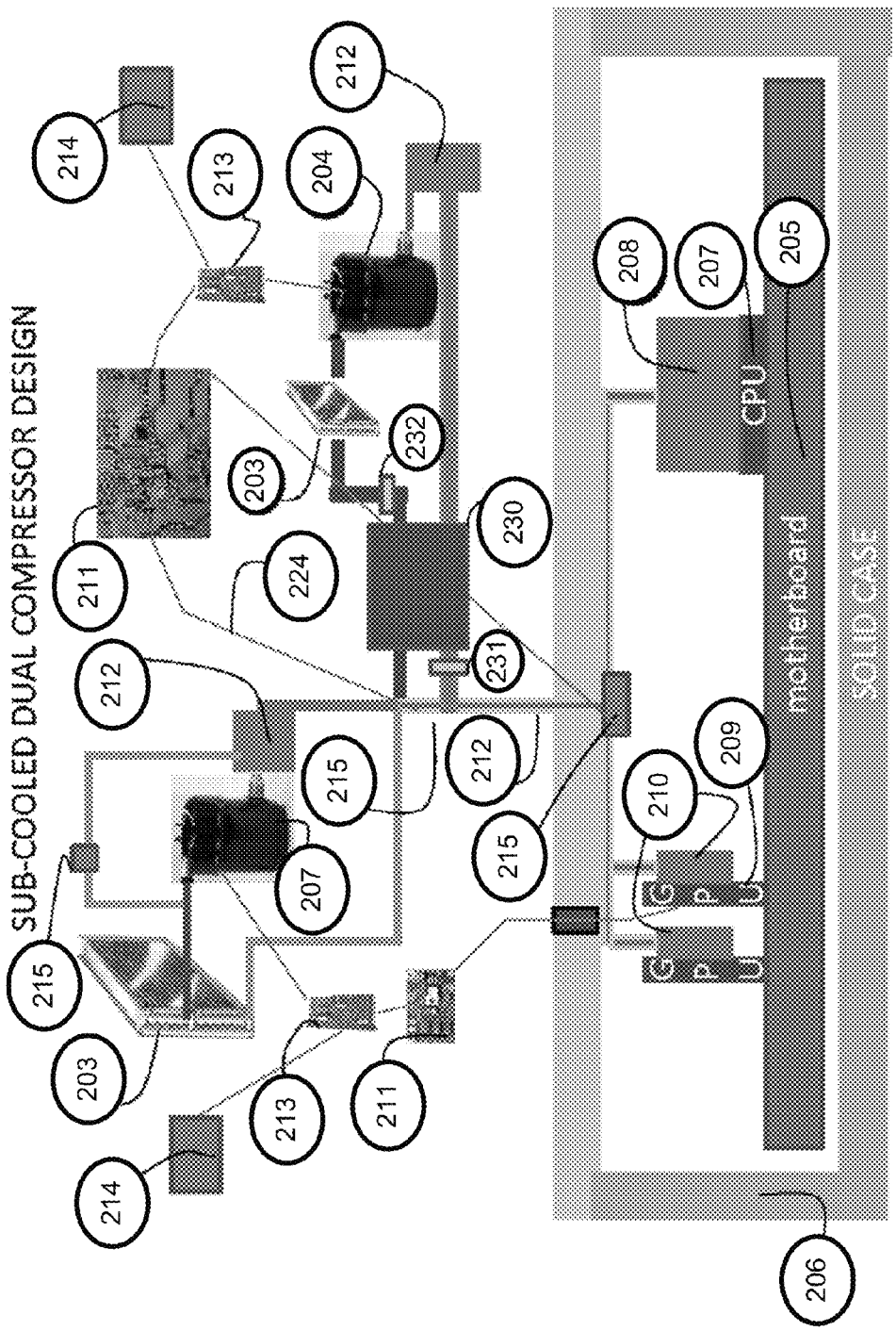
FIG. 19 is a schematic diagram of a sub-cooled dual compressor system for controlling the temperature of an electronic component of a computer, in accordance with various embodiments.

FIG. 19 is a schematic diagram of a sub-cooled dual compressor system (1900) for controlling the temperature of an electronic component of a computer, in accordance with various embodiments. FIG. 19 shows a dual compressor design similar to FIG. 18, also with two separate cooling circuits, each cooling circuit includes its own compressor (204), condenser coil (203), and circuit board (211). In this embodiment, one cooling circuit acts as a sub-cooler to cool the refrigerant gas from the other circuit before it re-enters the CPU and GPU, which may be controlled using proportional or open and closed solenoid valves (215) to control the flow of refrigerant to either the CPU or GPU. System (1900) further includes sub-cooling solenoid 230 with inlets 231 and 232. The use of the sub-cooler lowers the temperature and improves the cooling efficiency of the refrigerant when removing heat from the cooling block.

It should be noted that any of the embodiments listed above in FIGS. 17-19 may be used with one or more CPUs and one or more GPUs, as either the refrigeration circuit may be split to accommodate multiple processors from a single refrigeration circuit. Alternatively, multiple compressors and/or refrigeration circuits may be used to accommodate additional CPUs and/or GPUs depending on the cooling load required.

Returning to FIG. 17, system (1700) includes a compressor (204), a condenser (203), a heat exchanger (208), a temperature sensor (not shown) and a processor (213). Compressor (204) compresses a refrigerant. Condenser (203) receives the refrigerant from compressor (204). Condenser (203) condenses the refrigerant.

Heat exchanger (208) is thermally coupled to electronic component (207) of computer (205). A heat exchanger, as used herein, is a device used to transfer the thermal energy from one medium to another medium. A medium can be a solid, liquid, or gas. A heat exchanger can be, but is not limited to, a cooling block. Heat exchanger (208) receives the refrigerant from condenser (203). Heat exchanger (208) transfers the thermal energy from electronic component (207) to the refrigerant. Heat exchanger (208) sends the refrigerant back to compressor (204).

The temperature sensor measures the temperature of electronic component (207). Processor (213) is in electronic communication with the temperature sensor and compressor (204). This electronic communication can include data and control information. Processor (213) can include a microprocessor, microcontroller, an application specification integrated circuit, a circuit board, or any electronic circuit capable of executing instructions and receiving and sending data and control signals. Processor (213) reads the temperature sensor. Processor (213) adjusts the speed of the compressor based on the read temperature in order to maintain a pre-defined temperature range for the electronic component (207). The pre-defined temperature range for electronic component (207) is the operating temperature of electronic component (207) and a temperature above the dew point, for example.

In various embodiments, system (1700) can include solenoid valve (215). Solenoid valve (215) controls the flow of the refrigerant from condenser (203) to heat exchanger (208). Solenoid valve (215) is in electronic communication with processor (213). Processor (213) further adjusts solenoid valve (215) in addition to the speed of compressor (204) based on the read temperature in order to maintain a pre-defined temperature range for electronic component (207).

In various embodiments, system (1700) can control the temperature of two or more electronic components. For example, system (1700) can include one or more additional solenoid valves (215) that control the flow of the refrigerant from condenser (203) to one or more additional heat exchangers (210). Heat exchangers (210) are thermally coupled to one or more additional electronic components (209) of the computer (205). One or more additional temperature sensors (not shown) measure temperatures of one or more additional electronic components (209). One or more additional solenoid valves (215) and the one or more additional temperature sensors are in electronic communication with processor (213). Processor (213) reads the one or more additional temperature sensors. Processor (213) further adjusts one or more additional solenoid valves (215) based on the read temperatures in addition to the speed of compressor (204) to maintain pre-defined temperature ranges for one or more additional electronic components (209).

In various embodiments heat exchanger (208) is thermally coupled to electronic component (207) by physically connecting heat exchanger (208) to electronic component (207), as shown in FIG. 17.

In various embodiments, heat exchanger (208) is thermally coupled to electronic component (207) by physically connecting heat exchanger (208) to a liquid cooling system (not shown) that cools an electronic component. In this way, system (1700) can be used to indirectly control the temperature of an electronic component by controlling the temperature of the liquid used to cool the electronic component. System (1700) can, therefore, be used to control the temperature of electronic components that have existing cooling systems.

In various embodiments, electronic component (207) is a central processing unit of computer (205). In various embodiments, electronic component (209) is a graphics processing unit of computer (205).

In various embodiments, the temperature sensor is a temperature sensor of computer (205). For example, the temperature sensor can be a sensor that produces an output of the fan controller of computer (205). In various embodiments, system (1700) can include electronic circuit (211) to convert the output of a fan controller of computer (25) in order to read the temperature sensor of computer (205).

In various embodiments, the temperature sensor is a sensor physically connected to electronic component (207).

Figure 20:
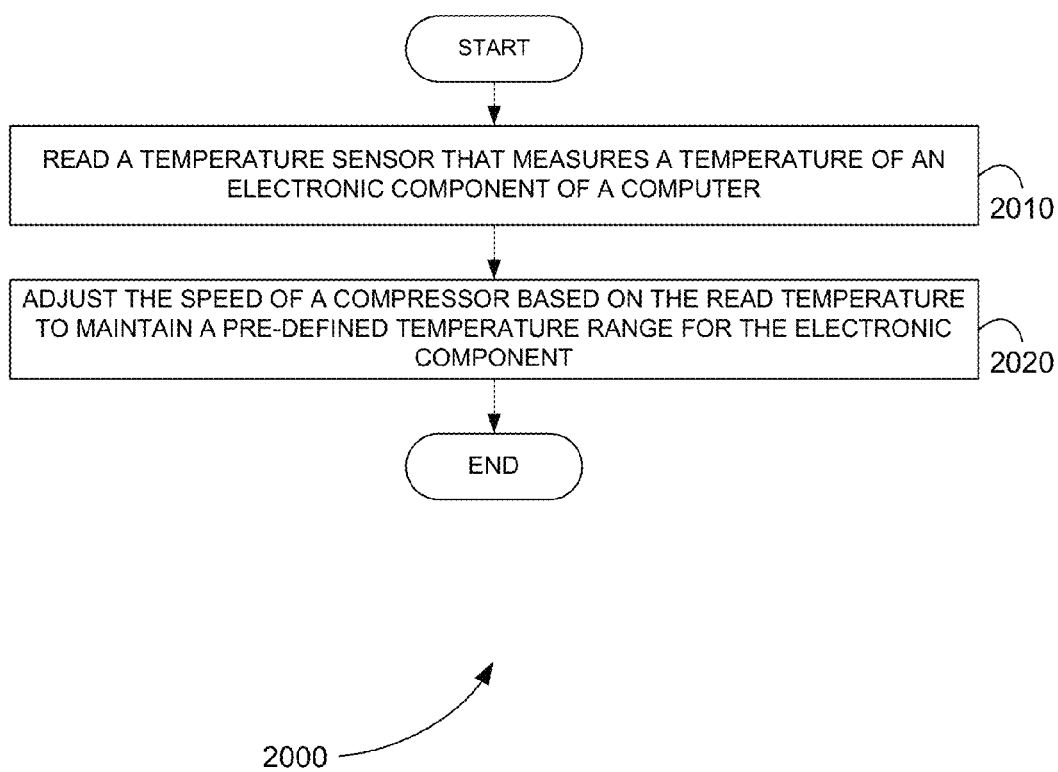
FIG. 20 is a flowchart showing a method for controlling the temperature of an electronic component of a computer, in accordance with various embodiments.

FIG. 20 is a flowchart showing a method 2000 for controlling the temperature of an electronic component of a computer, in accordance with various embodiments.

In step 2010 of method 2000, a temperature sensor is read that measures a temperature of an electronic component of a computer.

In step 2020, the speed of a compressor is adjusted based on the read temperature to maintain a pre-defined temperature range for the electronic component. The compressor compresses a refrigerant. The refrigerant is sent to a condenser that condenses the refrigerant. The refrigerant is sent to a heat exchanger that is thermally coupled to the electronic component and that transfers the thermal energy from the electronic component to the refrigerant. Finally, the refrigerant is sent back to the compressor.

In various embodiments, a computer program product includes a tangible computer-readable storage medium whose contents include a program with instructions being executed on a processor so as to perform a method for controlling the temperature of an electronic component of a computer. This method is performed by a system of distinct software modules.

Figure 21:
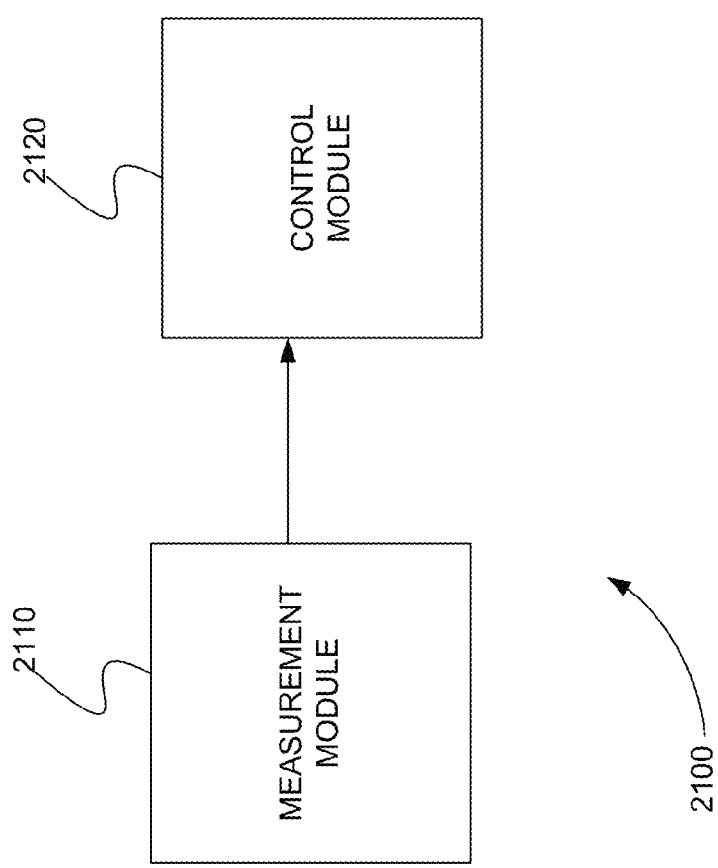
FIG. 21 is a schematic diagram of a system of distinct software modules that performs a method for controlling the temperature of an electronic component of a computer, in accordance with various embodiments.

FIG. 21 is a schematic diagram of a system 2100 of distinct software modules that performs a method for controlling the temperature of an electronic component of a computer, in accordance with various embodiments. System 2100 includes a measurement module 2110 and a control module 2120. Measurement module reads a temperature sensor that measures a temperature of an electronic component of a computer.

Control module 2120 adjusts the speed of a compressor based on the read temperature to maintain a pre-defined temperature range for the electronic component. The compressor compresses a refrigerant. The refrigerant is sent to a condenser that condenses the refrigerant. The refrigerant is sent to a heat exchanger that is thermally coupled to the electronic component and that transfers the thermal energy from the electronic component to the refrigerant. Finally, the refrigerant is sent back to the compressor.

The processes, sequences or steps and features discussed above are related to each other and each is believed independently novel in the art. The disclosed processes and sequences may be performed alone or in any combination to provide a novel and unobvious system or a portion of a system. It should be understood that the processes and sequences in combination yield an equally independently novel combination as well, even if combined in their broadest sense; i.e. with less than the specific manner in which each of the processes or sequences has been reduced to practice.

Figure 22:
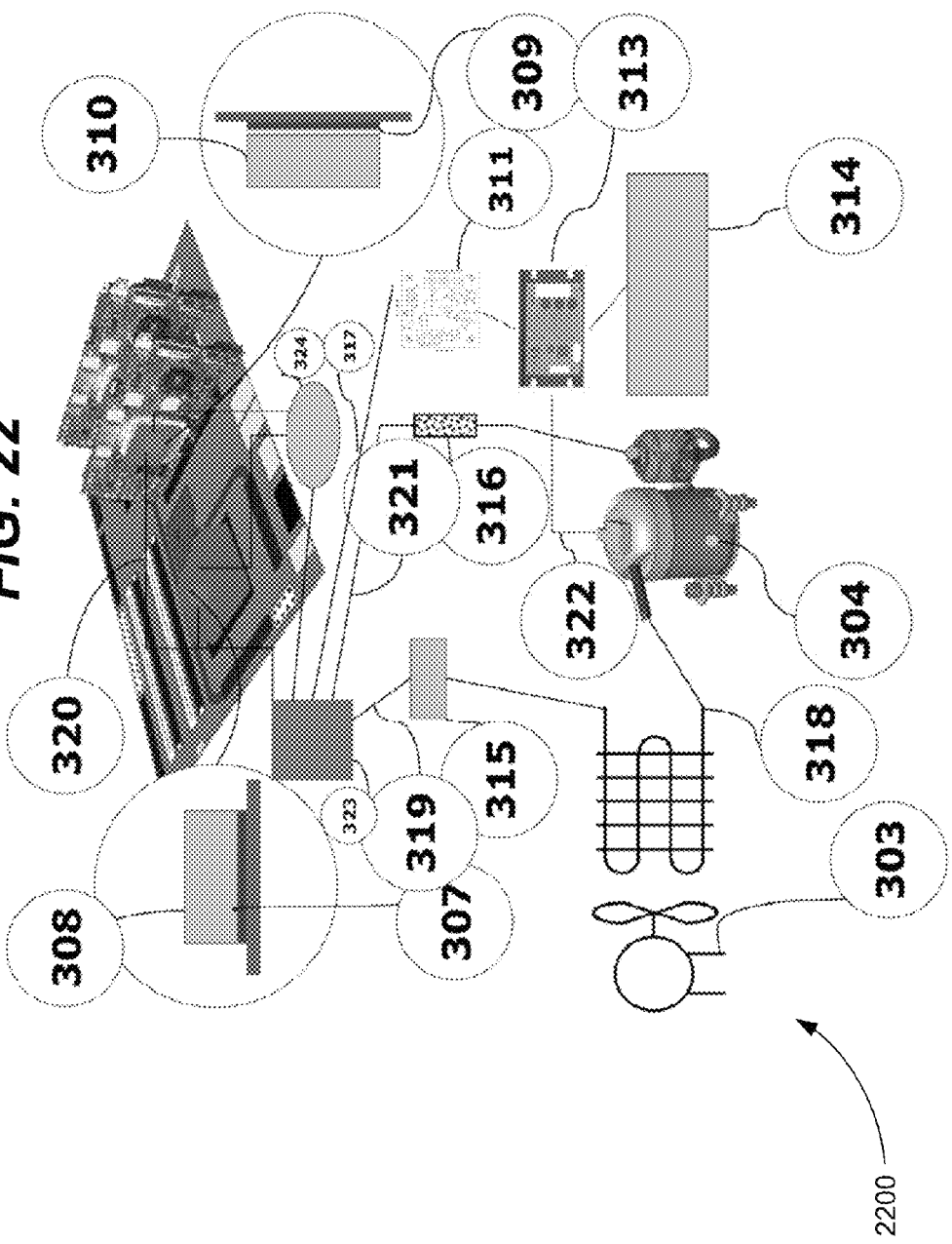
FIG. 22 is a schematic diagram of a system for controlling the temperature of an electronic component of a computer that is thermally coupled to the electronic component through a liquid circulating system, in accordance with various embodiments.

FIG. 22 is a schematic diagram of a system (2200) for controlling the temperature of an electronic component of a computer that is thermally coupled to the electronic component through a liquid circulating system, in accordance with various embodiments. The liquid of the liquid circulating system can include, but is not limited to, water, gylcol, a dielectric fluid, or any other fluid used to cool an electronic component. System (2200) cools the liquid of the liquid circulating system that, in turn, is used to cool the electronic component. The liquid is cooled in reservoir (323), for example, using a heat exchanger (inside the reservoir (323) and not shown) of system (2200). A temperature sensor (317) of system (2200) reads the temperature inside reservoir (323) and sends this reading to controller board (311) that, in turn, sends the temperature signal to compressor controller board (313) of system (2200). Controller board (311) permits a fine control of the liquid temperature inside reservoir (323). Reservoir (323) is connected to cooling blocks (308 and 310), which, in turn, are used to cool electronic components (307 and 309). Each of cooling blocks (308 and 310) receives the cooling liquid from reservoir (323). Pump (324) circulates the cooling liquid from reservoir (323) through lines (320) to cooling blocks (308 and 310) and back to reservoir (323).

System (2200) includes compressor (304), condenser coil (318), fan (303), the heat exchanger (not shown), temperature sensor (317), solenoid valves (315), and compressor controller board (313). Compressor (304) compresses refrigerant. This refrigerant is received by condenser (318). The flow of refrigerant from condenser (318) in line (319) to the heat exchanger in reservoir (323) is controlled by solenoid valves (315). Solenoid valves (315) are proportional or open and close valves, for example. Solenoid valves (315) are also controlled by compressor controller (313), for example. Refrigerant in the heat exchanger absorbs the thermal energy of the liquid in reservoir (323). The refrigerant then flows from the heat exchanger to dryer (316) through line (322) back to compressor (304). Power is supplied to compressor controller (313) using power supply (314). The use of reservoir (323) and the heat exchanger allow a modular design and remove the need for high pressure lines on the inside of the chassis housing of a mother board of a computer.

While the embodiment discussed herein may appear to include some limitations as to the presentation of the units, in terms of the format and arrangement, the invention has applicability well beyond such embodiment, which can be appreciated by those skilled in the art.

The forgoing and attached if any are illustrative of various aspects or embodiments of the present invention, the disclosure of specific sequence or steps and the inclusion of specifics with regard to broader methods and systems are not intended to limit the scope of the invention which finds itself in the various permutations of the features disclosed and described herein as conveyed to one of skill in the art.

What is claimed is:

1. A system for controlling the temperature of an electronic component of a computer, comprising:
    a compressor that compresses a refrigerant;
    a condenser that receives the refrigerant from the compressor and condenses the refrigerant;
    a heat exchanger that is thermally coupled to an electronic component of a computer, receives the refrigerant from the condenser, transfers thermal energy from the electronic component to the refrigerant, and sends the refrigerant back to the compressor;
    a temperature sensor that measures a temperature of the electronic component;
    a processor in electronic communication with the temperature sensor and the compressor that reads the temperature sensor and adjusts the speed of the compressor based on the read temperature in order to maintain a pre-defined temperature range for the electronic component;
    a solenoid valve that controls the flow of the refrigerant from the condenser to the heat exchanger and that is in electronic communication with the processor, wherein the processor further adjusts the solenoid valve in addition to the seed of the com ressor based on the read temperature in order to maintain a pre-defined temperature range for the electronic component; and
    one or more additional solenoid valves that control the flow of the refrigerant from the condenser to one or more additional heat exchangers thermally coupled to one or more additional electronic components of the computer and one or more additional temperature sensors that measure temperatures of the one or more additional electronic components, wherein the one or more additional solenoid valves and the one or more additional temperature sensors are in electronic communication with the processor, the processor reads the one or more additional temperature sensors, and the processor further adjusts the one or more additional solenoid valves based on the read temperatures in addition to the speed of the compressor to maintain pre-defined temperature ranges for the one or more additional electronic components.

2. The system of claim 1, wherein the heat exchanger is thermally coupled to the electronic component by physically connecting the heat exchanger to the electronic component.

3. The system of claim 1, wherein the heat exchanger is thermally coupled to the electronic component by physically connecting the heat exchanger to a liquid cooling system that cools the electronic component.

4. The system of claim 1, wherein the electronic component comprises a central processing unit of the computer.

5. The system of claim 1, wherein the electronic component comprises a graphics processing unit of the computer.

6. The system of claim 1, wherein the temperature sensor is a temperature sensor of the computer.

7. The system of claim 6, further comprising an electronic circuit connected between the processor and the computer to convert the output of a fan controller of the computer in order to read the temperature sensor of the computer.

8. The system of claim 1, wherein the temperature sensor comprises a sensor physically connected to the electronic component.

* * * * *